United States Patent
Park et al.

(10) Patent No.: US 11,631,819 B2
(45) Date of Patent: Apr. 18, 2023

(54) PHOTOELECTRIC CONVERSION DEVICE, ORGANIC SENSOR AND ELECTRONIC DEVICE

(71) Applicant: Samsung Electronics Co., Ltd., Suwon-si (KR)

(72) Inventors: Kyung Bae Park, Hwaseong-si (KR); Sung Jun Park, Yongin-si (KR); Feifei Fang, Suwon-si (KR); Sung Young Yun, Suwon-si (KR); Seon-Jeong Lim, Yongin-si (KR); Youn Hee Lim, Suwon-si (KR); Chul Joon Heo, Busan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 173 days.

(21) Appl. No.: 17/157,044

(22) Filed: Jan. 25, 2021

(65) Prior Publication Data

US 2021/0273180 A1   Sep. 2, 2021

(30) Foreign Application Priority Data

Feb. 27, 2020   (KR) ................. 10-2020-0024053

(51) Int. Cl.
*H01L 51/00* (2006.01)
*H01L 51/44* (2006.01)
*H01L 27/30* (2006.01)
*H01L 51/42* (2006.01)

(52) U.S. Cl.
CPC ...... *H01L 51/0072* (2013.01); *H01L 51/0046* (2013.01); *H01L 51/0047* (2013.01); *H01L 27/307* (2013.01); *H01L 51/4253* (2013.01); *H01L 51/442* (2013.01)

(58) Field of Classification Search
CPC ............. H01L 51/0072; H01L 51/0046; H01L 51/0047; H01L 51/4253
See application file for complete search history.

(56) References Cited

U.S. PATENT DOCUMENTS

| | | |
|---|---|---|
| 8,704,213 B2 | 4/2014 | Suzuki |
| 8,716,701 B2 | 5/2014 | So et al. |
| 9,997,571 B2 | 6/2018 | So et al. |

(Continued)

FOREIGN PATENT DOCUMENTS

| | | |
|---|---|---|
| JP | 5323025 B2 | 10/2013 |
| JP | 2015015415 A | 1/2015 |

(Continued)

*Primary Examiner* — Anthony Ho
(74) *Attorney, Agent, or Firm* — Harness, Dickey & Pierce, P.L.C.

(57) ABSTRACT

Disclosed are a photoelectric conversion device and an organic sensor and an electronic device including the same. The photoelectric conversion device includes a first and a second electrode, a photoelectric conversion layer between the first and the second electrode and configured to absorb light in at least one portion of a wavelength spectrum and to convert the absorbed light into an electric signal, and a buffer layer between the second electrode and the photoelectric conversion layer and including a mixture of at least two materials. The mixture includes a first and a second material. The first material has an energy bandgap of at least about 3.2 eV and a HOMO energy level of at least about 6.0 eV. The second material has an energy bandgap of less than or equal to about 2.8 eV and a HOMO energy level of at least about 6.0 eV.

25 Claims, 34 Drawing Sheets

(56) References Cited

U.S. PATENT DOCUMENTS

| | | |
|---|---|---|
| 10,256,414 B2 | 4/2019 | Lim et al. |
| 10,505,146 B2 | 12/2019 | Heo et al. |
| 2014/0209173 A1 | 7/2014 | Momose |
| 2015/0372046 A1 | 12/2015 | Kim et al. |
| 2016/0013248 A1 | 1/2016 | Sawaki |
| 2017/0301479 A1 | 10/2017 | Moehl et al. |

FOREIGN PATENT DOCUMENTS

| | | |
|---|---|---|
| KR | 20130117652 A | 10/2013 |
| KR | 20150066616 A | 6/2015 |
| KR | 20180024296 A | 3/2018 |

PHOTOELECTRIC CONVERSION DEVICE, ORGANIC SENSOR AND ELECTRONIC DEVICE

CROSS-REFERENCE TO RELATED APPLICATION

This application claims priority to and the benefit of Korean Patent Application No. 10-2020-0024053 filed in the Korean Intellectual Property Office on Feb. 27, 2020, the entire contents of which are incorporated herein by reference.

BACKGROUND

1. Field

A photoelectric conversion device, an organic sensor, and an electronic device are disclosed.

2. Description of Related Art

A photoelectric conversion device converts light into an electrical signal using photoelectric effects. The photoelectric conversion device includes a photodiode and a photo transistor, and the like, and it may be applied to a sensor or a photodetector.

Sensors are increasingly demanding higher resolution, resulting in smaller pixel sizes. At present, a silicon photodiode is widely used, but it may have deteriorated sensitivity since silicon photodiodes have a smaller absorption area due to small pixels. Accordingly, an organic material that is capable of replacing silicon has been researched.

The organic material may have a high extinction coefficient and be configured to selectively absorb light in a particular wavelength spectrum depending on a molecular structure, and thus may simultaneously replace a photodiode and a color filter and resultantly improve sensitivity and contribute to high integration.

However, the organic material may differ from silicon due to its high binding energy and recombination behavior. It may be difficult to accurately predict the characteristics of organic materials, which may make it difficult to easily control properties required for photoelectric conversion devices.

SUMMARY

Example embodiments provide a photoelectric conversion device capable of improving photoelectric conversion efficiency, charge extraction characteristics, and thermal stability.

Example embodiments provide an organic sensor including the photoelectric conversion device.

Example embodiments provide an electronic device including the photoelectric conversion device or the organic sensor.

According to example embodiments, a photoelectric conversion device includes a first electrode, a second electrode on the first electrode, a photoelectric conversion layer between the first electrode and the second electrode, and a buffer layer between the second electrode and the photoelectric conversion layer. The photoelectric conversion layer may be configured to absorb light in at least one portion of a wavelength spectrum and to convert the absorbed light into an electric signal. The buffer layer may include a mixture of at least two materials. The mixture may include a first material and a second material. The first material may have an energy bandgap of greater than or equal to about 3.2 eV and a HOMO energy level of greater than or equal to about 6.0 eV. The second material may have an energy bandgap of less than or equal to about 2.8 eV and a HOMO energy level of greater than or equal to about 6.0 eV.

In some embodiments, a LUMO energy level of the buffer layer may be deeper or shallower within about 30% of a LUMO energy level of the photoelectric conversion layer.

In some embodiments, a LUMO energy level of the buffer layer may be about 3.0 eV to about 4.5 eV.

In some embodiments, a HOMO energy level of the buffer layer may be deeper than a HOMO energy level of the photoelectric conversion layer by greater than or equal to about 0.5 eV.

In some embodiments, the HOMO energy level of the buffer layer may be about 6.0 eV to about 7.0 eV.

In some embodiments, an energy bandgap of the buffer layer may be between the energy bandgap of the first material and the energy bandgap of the second material.

In some embodiments, a surface roughness of the buffer layer measured by the atomic force microscope may be smaller than a surface roughness of a thin film made of the first material and a surface roughness of a thin film made of the second material, respectively.

In some embodiments, the surface roughness of the buffer layer may be less than or equal to about 1.2 nm.

In some embodiments, the buffer layer may have an amorphous structure.

In some embodiments, the first material may be an organic material including an aromatic ring, a heteroaromatic ring, or a combination thereof, and the second material may be a fullerene or a fullerene derivative.

In some embodiments, the first material may be represented by Chemical Formula 1.

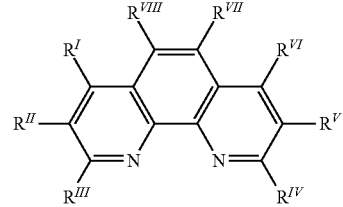

[Chemical Formula 1]

In Chemical Formula 1, $R^I$ to $R^{VIII}$ independently may be hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group, and $R^I$ to $R^{VIII}$ may be independently present or an adjacent two thereof may be combined to form a ring.

In some embodiments, a mixing volume ratio of the first material and the second material may be about 5:5 to about 9:1.

In some embodiments, the photoelectric conversion layer may include an organic absorbing material configured to selectively absorb one of a blue wavelength spectrum, a green wavelength spectrum, a red wavelength spectrum, and a near infrared wavelength spectrum.

In some embodiments, the first electrode may be an anode and the second electrode may be a cathode.

In some embodiments, the second electrode may be a light-receiving electrode.

In some embodiments, the second material may be a fullerene or a fullerene derivative.

In some embodiments, the photoelectric junction layer may include a p-type semiconductor and an n-type semiconductor. The HOMO energy level of the first material may be about 6.0 eV to about 7.0 eV, and the HOMO energy level of the second material may be about 6.0 eV to about 7.0 eV. The energy band gap of the first material may be about 3.2 eV to about 4.0 eV. The energy band gap of the second material may be about 1.8 eV to about 2.8 eV. The HOMO energy level of the second material may be about 6.0 eV to about 7.0 eV.

In some embodiments, the p-type semiconductor may be represented by Chemical Formula A:

EDM1-LM1-EAM1    [Chemical Formula A]

In Chemical Formula A,

EDM1 may be an electron donating moiety,

EAM1 may be an electron accepting moiety, and

LM1 may be a π-conjugated linking moiety that links the electron donating moiety and the electron accepting moiety.

In some embodiments, the n-type semiconductor may include thiophene, a thiophene derivative, fullerene, or a fullerene derivative.

Example embodiments provide an organic sensor including the photoelectric conversion device.

In some embodiments, the organic sensor may further include a semiconductor substrate stacked with the photoelectric conversion device.

In some embodiments, the organic sensor may further include a photodiode integrated in the semiconductor substrate.

According to example embodiments, an electronic device includes the photoelectric conversion device or the organic sensor.

The photoelectric conversion device may have improved photoelectric conversion efficiency, charge extraction characteristics, and thermal stability.

DETAILED DESCRIPTION

Figure 1:
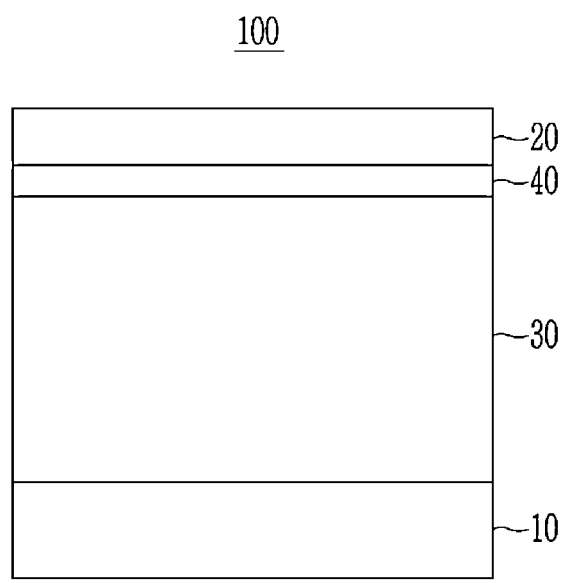
FIG. 1 is a cross-sectional view showing an example of a photoelectric conversion device according to example embodiments.

Hereinafter, example embodiments of the present disclosure will be described in detail so that a person skilled in the art would understand the same. However, this disclosure may be embodied in many different forms and is not to be construed as limited to the presented embodiments set forth herein.

In the drawings, the thickness of layers, films, panels, regions, etc., are exaggerated for clarity.

It will be understood that when an element such as a layer, film, region, or substrate is referred to as being "on" another element, it may be directly on the other element or intervening elements may also be present. In contrast, when an element is referred to as being "directly on" another element, there are no intervening elements present.

Expressions such as "at least one of," when preceding a list of elements (e.g., A, B, and C), modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

As used herein, when a definition is not otherwise provided, "substituted" refers to replacement of a hydrogen atom of a compound or a group by a substituent selected from a halogen atom, a hydroxyl group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, phosphoric acid or a salt thereof, silyl group, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when a definition is not otherwise provided, "hetero" refers to one including 1 to 4 heteroatoms selected from N, O, S, Se, Te, Si, and P.

Hereinafter, "combination" refers to a mixture of two or more and a stack structure of two or more.

Hereinafter, when a definition is not otherwise provided, the energy level is the highest occupied molecular orbital (HOMO) energy level or the lowest unoccupied molecular orbital (LUMO) energy level.

Hereinafter, when a definition is not otherwise provided, a work function or an energy level is expressed as an absolute value from a vacuum level. In addition, when the work function or the energy level is referred to be deep, high, or large, it may have a large absolute value based on "0 eV" of the vacuum level while when the work function or the energy level is referred to be shallow, low, or small, it may have a small absolute value based on "0 eV" of the vacuum level. Further, the differences between the work function and/or the energy level may be values obtained by subtracting a small value of the absolute value from a large value of the absolute value.

Hereinafter, when a definition is not otherwise provided, the HOMO energy level may be evaluated with an amount of photoelectrons emitted by energy when irradiating UV light to a thin film using AC-2 (Hitachi) or AC-3 (Riken Keiki Co., Ltd.).

Hereinafter, when a definition is not otherwise provided, the LUMO energy level may be obtained by obtaining an energy bandgap using a UV-Vis spectrometer (Shimadzu Corporation), and then calculating the LUMO energy level from the energy bandgap and the already measured HOMO energy level.

Hereinafter, with reference to drawings, a photoelectric conversion device according to an embodiment is described.

FIG. 1 is a cross-sectional view showing an example of a photoelectric conversion device according to example embodiments.

Referring to FIG. 1, a photoelectric conversion device 100 according to example embodiments includes a first electrode 10, a second electrode 20, a photoelectric conversion layer 30, and a buffer layer 40.

A substrate (not shown) may be disposed at the side of the first electrode 10 or the second electrode 20. The substrate may be for example an inorganic substrate such as a glass plate or silicon wafer or an organic substrate made of an organic material such as polycarbonate, polymethylmethacrylate, polyethyleneterephthalate, polyethylenenaphthalate, polyamide, polyethersulfone, or a combination thereof. The substrate may be omitted.

One of the first electrode 10 and the second electrode 20 is an anode and the other is a cathode. For example, the first electrode 10 may be an anode and the second electrode 20 may be a cathode. For example, the first electrode 10 may be a cathode and the second electrode 20 may be an anode.

At least one of the first electrode 10 and the second electrode 20 may be a transparent electrode. Herein, the transparent electrode may have a light transmittance of greater than or equal to about 80% (and less than or equal to 100%). The transparent electrode may include for example at least one of an oxide conductor, a carbon conductor, and a metal thin film. The oxide conductor may include at least one of indium tin oxide (ITO), indium zinc oxide (IZO), zinc tin oxide (ZTO), aluminum tin oxide (AlTO), and aluminum zinc oxide (AZO), the carbon conductor may include at least one of graphene and carbon nanostructure, and the metal thin film may be a very thin film including aluminum (Al), magnesium (Mg), silver (Ag), gold (Au), an alloy thereof, or a combination thereof.

One of the first electrode 10 and the second electrode 20 may be a reflective electrode. Herein, the reflective electrode may have, for example, a light transmittance of less than about 10% or high reflectance of less than or equal to about 5% (and greater than or equal to 0%). The reflective electrode may include a reflective conductor such as a metal and may include, for example aluminum (Al), silver (Ag), gold (Au), or an alloy thereof.

For example, the first electrode 10 and the second electrode 20 may be transparent electrodes, and one of the first electrode 10 and the second electrode 20 is a light-receiving electrode at a side receiving light. For example, the second electrode 20 may be a light-receiving electrode.

For example, the first electrode 10 may be a transparent electrode, the second electrode 20 may be a reflective electrode, and the first electrode 10 may be a light-receiving electrode.

For example, the first electrode 10 may be a reflective electrode, the second electrode 20 may be a transparent electrode, and the second electrode 20 may be a light-receiving electrode.

The photoelectric conversion layer 30 may be between the first electrode 10 and the second electrode 20.

The photoelectric conversion layer 30 may be configured to absorb light in at least one portion of a wavelength spectrum and may be configured to convert the absorbed light into an electric signal, for example one of light in a blue wavelength spectrum (hereinafter, referred to as "blue light"), light in a green wavelength spectrum (hereinafter, referred to as "green light"), light in a red wavelength spectrum (hereinafter, referred to as "red light"), and light in an infrared wavelength spectrum (hereinafter, referred to as "infrared light") into an electric signal.

For example, the photoelectric conversion layer 30 may be configured to selectively absorb at least one of the blue light, green light, red light, and infrared light and to convert them into an electric signal. Herein, the selective absorption of at least one from the blue light, green light, red light, and the infrared light means that a maximum absorption wavelength ($\lambda_{max}$) of an absorption spectrum exists in one of wavelength spectra of greater than or equal to about 380 nm and less than about 500 nm, about 500 nm to about 600 nm, greater than about 600 nm and less than or equal to about 700 nm, and greater than about 700 nm and less than or equal to about 3000 nm, and the absorption spectrum in the corresponding wavelength spectrum is significantly higher than those in the other wavelength spectra, wherein the "significantly higher" means, for example, about 70% to about 100%, about 75% to about 100%, about 80% to about 100%, about 85% to about 100%, about 90% to about 100%, or about 95% to about 100% of the total area of the absorption spectrum belongs to the corresponding wavelength spectrum.

The photoelectric conversion layer 30 may include at least one p-type semiconductor and at least one n-type semiconductor which form a pn junction and may produce excitons by receiving light from outside and then separate the produced excitons into holes and electrons.

The p-type semiconductor and the n-type semiconductor may be independently light-absorbing materials, and for example at least one of the p-type semiconductor and the n-type semiconductor may be an organic light-absorbing material. For example, at least one of the p-type semiconductor and the n-type semiconductor may be a wavelength-selective light-absorbing material configured to selectively absorb light in a predetermined wavelength spectrum, and for example at least one of the p-type semiconductor and the n-type semiconductor may be a wavelength-selective organic light-absorbing material. The p-type semiconductor and the n-type semiconductor may have a peak absorption wavelength ($\lambda_{max}$) in the same wavelength spectrum or in a different wavelength spectrum.

For example, at least one of the p-type semiconductor and the n-type semiconductor may be an absorbing material having a maximum absorption wavelength ($\lambda_{max}$) in a wavelength spectrum of about 500 nm to about 600 nm, for example, a maximum absorption wavelength ($\lambda_{max}$) in a wavelength spectrum of about 520 nm to about 580 nm.

For example, at least one of the p-type semiconductor and the n-type semiconductor may be an organic absorbing material having a maximum absorption wavelength ($\lambda_{max}$) in a wavelength spectrum of about 500 nm to about 600 nm, for example, a maximum absorption wavelength in a wavelength spectrum of about 520 nm to about 580 nm ($\lambda_{max}$).

For example, the p-type semiconductor may be an organic absorbing material having a maximum absorption wavelength ($\lambda_{max}$) in a wavelength spectrum of about 500 nm to about 600 nm, for example, an organic absorbing material having a maximum absorption wavelength ($\lambda_{max}$) in a wavelength spectrum of about 520 nm to about 580 nm.

For example, a HOMO energy level of the p-type semiconductor may be about 5.0 eV to about 6.0 eV, and may be about 5.1 eV to about 5.9 eV, about 5.2 eV to about 5.8 eV, or about 5.3 eV to about 5.8 eV. For example, a LUMO energy level of the p-type semiconductor may be about 2.7 eV to about 4.3 eV, and may be about 2.8 eV to about 4.1 eV or about 3.0 eV to about 4.0 eV. For example, an energy bandgap of the p-type semiconductor may be about 1.7 eV to about 2.3 eV, and may be about 1.8 eV to about 2.2 eV or about 1.9 eV to about 2.1 eV.

For example, the p-type semiconductor may be an organic material having a core structure including an electron donating moiety (EDM), a π-conjugated linking moiety (LM), and an electron accepting moiety (EAM).

The p-type semiconductor may be for example represented by Chemical Formula A, but is not limited thereto.

EDM1-LM1-EAM1  [Chemical Formula A]

In Chemical Formula A,
EDM1 may be an electron donating moiety,
EAM1 may be an electron accepting moiety, and
LM1 may be a π-conjugated linking moiety that links the electron donating moiety and the electron accepting moiety.

For example, the p-type semiconductor represented by Chemical Formula A may be represented by Chemical Formula A-1.

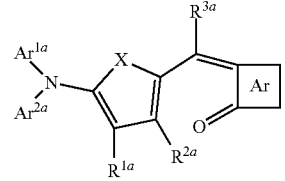

[Chemical Formula A-1]

In Chemical Formula A-1,
X may be O, S, Se, Te, SO, $SO_2$, or $SiR^aR^b$,
Ar may be a substituted or unsubstituted C6 to C30 arylene group, a substituted or unsubstituted C3 to C30 heterocyclic group, or a fused ring of the foregoing two or more,
$Ar^{1a}$ and $Ar^{2a}$ may independently be a substituted or unsubstituted C6 to C30 aryl group or a substituted or unsubstituted C3 to C30 heteroaryl group,
$Ar^{1a}$ and $Ar^{2a}$ may independently be a substituted or unsubstituted C6 to C30 aryl group or a substituted or unsubstituted C3 to C30 heteroaryl group, and
$R^{1a}$ to $R^{3a}$, $R^a$, and $R^b$ may independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a combination thereof.

For example, in Chemical Formula A-1, $Ar^{1a}$ and $Ar^{2a}$ may independently be one of a substituted or unsubstituted phenyl group, a substituted or unsubstituted naphthyl group, a substituted or unsubstituted anthracenyl group, a substituted or unsubstituted phenanthrenyl group, a substituted or unsubstituted pyridinyl group, a substituted or unsubstituted pyridazinyl group, a substituted or unsubstituted pyrimidinyl group, a substituted or unsubstituted pyrazinyl group, a substituted or unsubstituted quinolinyl group, a substituted or unsubstituted isoquinolinyl group, a substituted or unsubstituted naphthyridinyl group, a substituted or unsubstituted cinnolinyl group, a substituted or unsubstituted quinazolinyl group, a substituted or unsubstituted phthalazinyl group, a substituted or unsubstituted benzotriazinyl group, a substituted or unsubstituted pyridopyrazinyl group, a substituted or unsubstituted pyridopyrimidinyl group, and a substituted or unsubstituted pyridopyridazinyl group.

For example, $Ar^{1a}$ and $Ar^{2a}$ of Chemical Formula A-1 may be linked to each other to form a ring or for example, $Ar^{1a}$ and $Ar^{2a}$ may be linked to each other by one of a single bond, $-(CR^{g}R^{h})_{n2}-$ (n2 is 1 or 2), $-O-$, $-S-$, $-Se-$, $-N=$, $-NR^{i}-$, $-SiR^{j}R^{k}-$, and $-GeR^{l}R^{m}-$ to form a ring. Herein, $R^{g}$ to $R^{m}$ may independently be hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a combination thereof.

For example, the p-type semiconductor represented by Chemical Formula A may be for example represented by one of Chemical Formulas A-2 to A-7.

[Chemical Formula A-2]

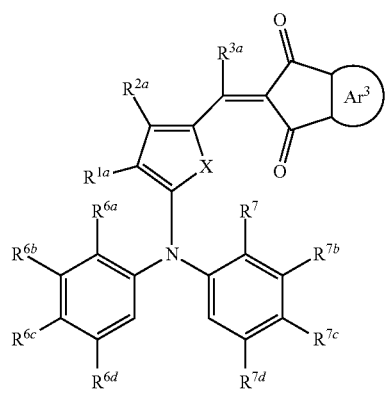

[Chemical Formula A-3]

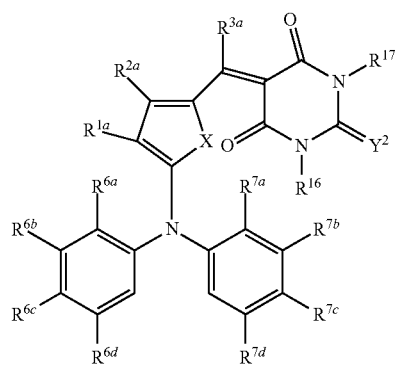

[Chemical Formula A-4]

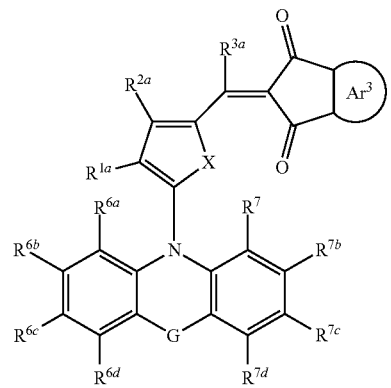

[Chemical Formula A-5]

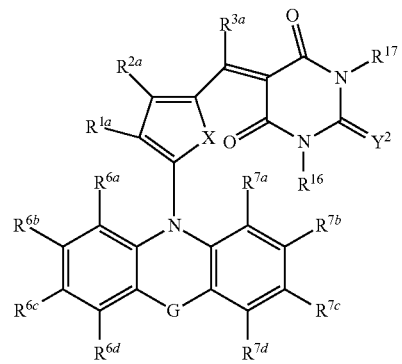

[Chemical Formula A-6]

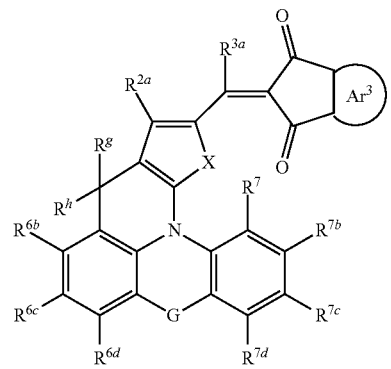

[Chemical Formula A-7]

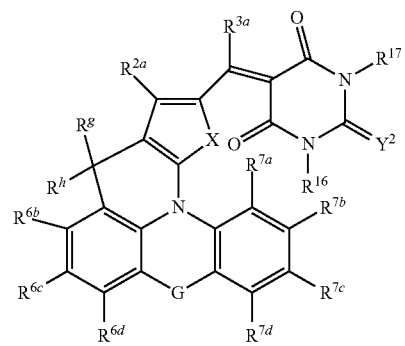

In Chemical Formulas A-2 to A-7,

X may be O, S, Se, Te, SO, $SO_2$, or $SiR^aR^b$, $Ar^3$ may be a substituted or unsubstituted C6 to C30 arylene group, a substituted or unsubstituted C3 to C30 heterocyclic group, or a fused ring of the foregoing two or more, $R^{1a}$ to $R^{3a}$, $R^a$, and $R^b$ may independently be one of hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a combination thereof, G may be one of a single bond, $—(CR^gR^h)_{n2}—$ (n2 is 1 or 2), —O—, —S—, —Se—, —N=, $—NR^i—$, $—SiR^jR^k—$, or $—GeR^lR^m—$, wherein $R^g$ to $R^m$ may independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a combination thereof, wherein $R^g$ and $R^h$, $R^j$ and $R^k$ and $R^l$ and $R^m$ may independently be present or may be linked to each other to form a ring, $Y^2$ may be O, S, Se, Te, or $C(R^q)$ (CN) (wherein $R^q$ is hydrogen, a cyano group (—CN), or a C1 to C10 alkyl group), $R^{6a}$ to $R^{6d}$, $R^{7a}$ to $R^{7d}$, $R^g$, $R^h$, $R^{16}$, and $R^{17}$ may independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, or a combination thereof, and $R^{1a}$ to $R^{3a}$, $R^{6a}$ to $R^{6d}$ and $R^{7a}$ to $R^{7d}$ may independently be present or two adjacent groups thereof may be linked to each other to form a fused ring.

For example, $Ar^3$ of Chemical Formulas A-2, A-4, and/or A-6 may be benzene, naphthylene, anthracene, thiophene, selenophene, tellurophene, pyridine, pyrimidine, or two or more fused rings selected from foregoing groups.

For example, the n-type semiconductor may be an organic material, an inorganic material or organic/inorganic material.

For example, a LUMO energy level of the n-type semiconductor may be about 3.6 eV to about 4.8 eV, and may be about 3.8 eV to about 4.6 eV, or about 3.9 eV to about 4.5 eV.

For example, the n-type semiconductor may be, for example, thiophene or a thiophene derivative, fullerene or a fullerene derivative, but is not limited thereto.

The photoelectric conversion layer 30 may be an intrinsic layer (an I layer), wherein the p-type semiconductor and the n-type semiconductor are blended as a bulk heterojunction. Herein, the p-type semiconductor and the n-type semiconductor may be blended in a volume ratio (thickness ratio) of about 1:9 to about 9:1, for example about 2:8 to about 8:2, about 3:7 to about 7:3, about 4:6 to about 6:4, or about 5:5.

The photoelectric conversion layer 30 may include a bi-layer including a p-type layer including the aforementioned p-type semiconductor and an n-type layer including the aforementioned n-type semiconductor. Herein, a thickness ratio of the p-type layer and the n-type layer may be about 1:9 to about 9:1, for example about 2:8 to about 8:2, about 3:7 to about 7:3, about 4:6 to about 6:4, or about 5:5.

The photoelectric conversion layer 30 may further include a p-type layer and/or an n-type layer, in addition to the intrinsic layer. The p-type layer may include the aforementioned p-type semiconductor and the n-type layer may include the aforementioned n-type semiconductor. For example, they may be included in various combinations of p-type layer/I layer, I layer/n-type layer, p-type layer/I layer/n-type layer, and the like.

The photoelectric conversion layer 30 may have a thickness of about 1 nm to 500 nm or about 5 nm to 300 nm. When the photoelectric conversion layer 30 has a thickness within the range, the active layer may be configured to effectively absorb light, effectively separate holes from electrons, and transfer them, thereby effectively improving photoelectric conversion efficiency.

The buffer layer 40 may be between the first electrode 10 and the second electrode 20 and between the second electrode 20 and the photoelectric conversion layer 30. For example, the buffer layer 40 may be in contact with the photoelectric conversion layer 30. For example, one surface of the buffer layer 40 may be in contact with the photoelectric conversion layer 30 and the other surface of the buffer layer 40 may be in contact with the second electrode 20.

The buffer layer 40 may be configured to effectively extract the first charge (for example, electrons) separated from the photoelectric conversion layer 30 toward the second electrode 20 and simultaneously when voltage is applied from the outside, it is possible to effectively block the second charge (for example, holes) from being reversely injected from the second electrode 20 to the photoelectric conversion layer 30. Accordingly, while improving the photoelectric conversion efficiency of the photoelectric conversion device 100, electrical characteristics of the photoelectric conversion device 100 may be improved by effectively reducing dark current and remaining electrons (remaining charge carriers).

The buffer layer 40 may be a blended buffer layer including a mixture of at least two materials. For example, the buffer layer 40 may be a single layer including the mixture.

The buffer layer 40 may include a mixture of first and second materials having different electrical characteristics and optical properties. The first and second materials may complementarily work and thus have synergistic effects of electrical and optical properties of the photoelectric conversion device 100.

The first material may be a buffer material capable of controlling injection and transport of second charges (e.g., holes) and simultaneously, providing optical transparency.

For example, a HOMO energy level of the first material may have a relatively large difference from that of the p-type semiconductor of the photoelectric conversion layer 30 and thus form a sufficient energy barrier blocking the second charges (e.g., holes) reversely injected into the photoelectric conversion layer 30. For example, the HOMO energy level of the first material and the HOMO energy level of the p-type semiconductor of the photoelectric conversion layer 30 may have a difference of greater than or equal to about 0.5 eV, for example, the HOMO energy level of the first material may be greater than or equal to about 0.5 eV deeper than that of the p-type semiconductor of the photoelectric conversion layer 30. Within the range, the HOMO energy level difference of the first material and the p-type semiconductor of the photoelectric conversion layer 30 may be within a range of about 0.5 eV to about 2.0 eV. For example, the HOMO energy level of the first material may be about 0.5 eV to about 2.0 eV deeper than that of the p-type semiconductor of the photoelectric conversion layer 30.

For example, the HOMO energy level of the first material may be greater than or equal to about 6.0 eV, for example about 6.0 eV to about 7.0 eV, about 6.0 eV to about 6.8 eV, about 6.0 eV to about 6.5 eV, about 6.2 eV to about 7.0 eV, about 6.2 eV to about 6.8 eV, or about 6.2 eV to about 6.5 eV.

For example, the first material may have a relatively large energy bandgap, for example, an energy bandgap of greater than or equal to about 3.2 eV. Within the range, the first material may have an energy bandgap of about 3.2 eV to about 4.0 eV, about 3.2 eV to about 3.8 eV, about 3.4 eV to about 4.0 eV, or about 3.4 eV to about 3.8 eV. The first material have the relatively large energy bandgap and thus may be a visible light non-absorbing material substantially not absorbing light in a visible wavelength spectrum (e.g., about 400 nm to about 700 nm). Accordingly, the first material may provide the buffer layer 40 with high optical transparency.

The second material may be an N-type material capable of controlling injection and transport of the second charges (e.g., holes) and simultaneously, effectively extracting the first charges (e.g., electrons).

For example, the HOMO energy level of the second material may have a relatively large difference from the HOMO energy level of the p-type semiconductor of the photoelectric conversion layer 30 and thus form a sufficient energy wall blocking reverse injection of the second charges (e.g., holes) to the photoelectric conversion layer 30. For example, the HOMO energy level of the second material may have a difference of greater than or equal to about 0.5 eV from that of the p-type semiconductor of the photoelectric conversion layer 30. For example, the HOMO energy level of the second material may be greater than or equal to about 0.5 eV deeper than that of the p-type semiconductor of the photoelectric conversion layer 30. Within the range, the HOMO energy level of the second material may have a difference of about 0.5 eV to about 2 eV from that of the p-type semiconductor of the photoelectric conversion layer 30. For example, the HOMO energy level of the second material may be about 0.5 eV to about 2.0 eV deeper than that of the p-type semiconductor of the photoelectric conversion layer 30.

For example, the HOMO energy level of the second material may be greater than or equal to about 6.0 eV, for example, about 6.0 eV to about 7.0 eV, about 6.0 eV to about 6.8 eV, about 6.0 eV to about 6.5 eV, about 6.1 eV to about 7.0 eV, about 6.1 eV to about 6.8 eV, about 6.1 eV to about 6.5 eV, about 6.2 eV to about 7.0 eV, about 6.2 eV to about 6.8 eV, or about 6.2 eV to about 6.5 eV.

In this way, the first material and the second material have substantially similar HOMO energy levels, and the HOMO energy level of the buffer layer 40 may be substantially the same as that of the first material or the second material. For example, the HOMO energy level of the buffer layer 40 may have a difference of greater than or equal to about 0.5 eV from that of the p-type semiconductor of the photoelectric conversion layer 30 and may be greater than or equal to about 0.5 eV deeper than that of the p-type semiconductor of the photoelectric conversion layer 30. Within the range, the HOMO energy level of the buffer layer 40 may have a difference of about 0.5 eV to about 2.0 eV from that of the p-type semiconductor of the photoelectric conversion layer 30 and may be about 0.5 eV to about 2.0 eV deeper than that of the p-type semiconductor of the photoelectric conversion layer 30.

For example, the HOMO energy level of the buffer layer 40 may be greater than or equal to about 6.0 eV, and for example, the HOMO energy level of the buffer layer 40 may be about 6.0 eV to about 7.0 eV, about 6.0 eV to about 6.8 eV, about 6.0 eV to about 6.5 eV, about 6.1 eV to about 7.0 eV, about 6.1 eV to about 6.8 eV, about 6.1 eV to about 6.5 eV, about 6.2 eV to about 7.0 eV, about 6.2 eV to about 6.8 eV, or about 6.2 eV to about 6.5 eV.

On the other hand, the LUMO energy level of the second material may have a small difference from that of the N-type semiconductor of the photoelectric conversion layer 30, for example, a difference of less than or equal to about 0.5 eV, and for example, a difference of about 0 eV to about 0.5 eV, about 0 eV to about 0.4 eV, about 0 eV to about 0.3 eV, about 0 eV to about 0.2 eV, or about 0 eV to about 0.1 eV. For example, the LUMO energy levels of the second material and the N-type semiconductor may be individually in a range of about 3.5 eV to about 4.5 eV.

The second material has the aforementioned LUMO energy level and thus may effectively improve mobility (extractability) of the first charges (e.g., electrons) from the photoelectric conversion layer 30 through the buffer layer 40 to the second electrode 20. Specifically, as described above, the first material may have a relatively high HOMO energy level and a relatively large energy bandgap, considering blocking characteristics and optical transparency of the second charges (e.g., holes), wherein mobility of the first charges (e.g., electrons) from the photoelectric conversion layer 30 to the second electrode 20 may be hindered due to the relatively shallow LUMO energy level of the first material. The second material may be blended with the first material and thus complement insufficient electrical characteristics of the first material and resultantly, may effectively control the LUMO energy level of the buffer layer 40.

Accordingly, the LUMO energy levels of the buffer layer 40 and the photoelectric conversion layer 30 may be effectively controlled to have a small difference, for example, the LUMO energy level of the buffer layer 40 may be deeper or shallower within about 30% than that of the photoelectric conversion layer 30. For example, the LUMO energy level of the buffer layer 40 may be present between those of the first material and the second material, for example, in a range of about 3.0 eV to about 4.5 eV, about 3.0 eV to about 4.2 eV, about 3.2 eV to about 4.2 eV, or about 3.5 eV to about 4.2 eV. For example, the LUMO energy level of the buffer layer 40 may be present between the LUMO energy level of the photoelectric conversion layer 30 and a work function of the second electrode 20.

The second material has the above energy level and thus a relatively small energy bandgap, for example, an energy bandgap of less than or equal to about 2.8 eV. Within the range, the energy bandgap of the second material may be in a range of about 1.8 eV to about 2.8 eV, about 2.0 eV to about 2.8 eV, about 2.1 eV to about 2.7 eV, or about 2.2 eV to about 2.5 eV. In this way, the second material has a relatively small energy bandgap and thus may be a visible light-absorbing material configured to absorb light in at least a portion of the visible wavelength spectrum (e.g., about 400 nm to about 700 nm).

The energy bandgap of the buffer layer 40 may be between energy bandgaps of the first material and the second material, for example, in a range of about 2.0 eV to about 3.0 eV, about 2.1 eV to about 2.9 eV, or about 2.2 eV to about 2.8 eV. Accordingly, compared with a case of using the second material alone, the visible light absorption characteristics may be greatly deteriorated, and accordingly, a loss of light flowing into the photoelectric conversion layer 30 may be effectively reduced.

Surface morphology of the buffer layer 40 may be different from those of thin films respectively formed of the first material and the second material alone. For example, the buffer layer 40 may effectively hinder aggregation or clustering of the first materials and/or the second materials due to interaction of the first and second materials and thus exhibit improved surface morphology compared with each thin film formed of the first material and/or the second material. For example, the surface roughness (RMS) of the buffer layer 40, which is measured with an atomic force microscope (AFM), may be respectively smaller than those of the thin films respectively formed of the first material and the second material. For example, the surface roughness of the buffer layer 40, which is measured with the atomic force microscope, may be less than or equal to about 1.2 nm, for example, less than or equal to about 1.1 nm, less than or equal to about 1.0 nm, less than or equal to about 0.8 nm, or less than or equal to about 0.7 nm.

On the other hand, an atom structure of the buffer layer 40 may differ from that of each thin film formed of the first material or the second material. For example, the thin film formed of the first material and/or the thin film formed of the second material has a crystalline structure, but the buffer layer 40 formed of a mixture of the first and second materials may have an amorphous structure by hindering mutual crystallization due to the interaction of the first and second materials.

Each of the first material and the second material may be a vapor-depositable compound. For example, during each thermogravimetric analysis under a pressure of less than or equal to about 1 Pa, temperatures (Ts10) where the first and second materials have about 10% weight loss from each initial weight may be respectively about 180° C. to about 450° C., about 190° C. to about 450° C., about 200° C. to about 450° C., about 210° C. to about 450° C., or about 220° C. to about 450° C., and temperatures (Ts50) where the first and second materials have 50% weight loss from each initial weight may be respectively about 200° C. to about 500° C., about 220° C. to about 500° C. or about 250° C. to about 500° C. The first and second materials have high heat resistance and thus may be stably repetitively deposited and maintain satisfactory performance without deterioration during the following high temperature process.

The first material and the second material may be selected from materials that satisfy the electrical, optical, and thermal properties described above. For example, at least one of the first material and the second material may be an organic material.

For example, the first material may be an organic material and may be, for example, a low molecular organic material (small molecule) including an aromatic ring, a heteroaromatic ring, or a combination thereof.

For example, the first material may include a heteroaromatic ring including at least one nitrogen.

For example, the first material may be represented by the following Chemical Formula 1, but is not limited thereto.

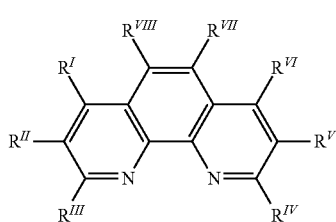

[Chemical Formula 1]

In Chemical Formula 1, $R^I$ to $R^{VIII}$ may independently be hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group, and $R^I$ to $R^{VIII}$ may independently be present or an adjacent two thereof may be combined to form a ring.

For example, at least one of $R^I$ to $R^{VIII}$ of Chemical Formula 1 may be a substituted or unsubstituted C6 to C30 aryl group.

For example, at least two of $R^I$ to $R^{VIII}$ of Chemical Formula 1 may be a substituted or unsubstituted C6 to C30 aryl group.

For example, at least one of $R^I$ to $R^{VIII}$ of Chemical Formula 1 may be a substituted or unsubstituted C1 to C30 alkyl group.

For example, at least two of $R^I$ to $R^{VIII}$ of Chemical Formula 1 may be a substituted or unsubstituted C1 to C30 alkyl group.

For example, the second material may be fullerene or a fullerene derivative. The fullerene may be, for example, C60, C70, C74, C76, or C78, but is not limited thereto. The fullerene derivative may have at least one functional group bound to the fullerene core. The functional group may be for example a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a hydroxyl group, a halogen, or a cyano group, but is not limited thereto.

In the buffer layer 40, the first material and the second material may be included in various mixing ratios, and the mixing volume ratio of the first material and the second material may be, for example, about 1:9 to about 9:1. For example, the first material may be included in a greater amount than or equal amount to the second material, for example, the mixing volume ratio of the first material and the second material may be about 5:5 to about 9:1.

The buffer layer 400 may have a thickness of about 1 nm to about 200 nm, or about 5 nm to about 100 nm.

The photoelectric conversion device 100 may further include an anti-reflection layer (not shown) on one surface of the first electrode 10 or the second electrode 20. The anti-reflection layer is disposed at a light incidence side and may lower reflectance of light of incident light and thereby light absorbance is further improved. For example, when light is incident to the first electrode 10, the anti-reflection layer may be disposed on one surface of the first electrode 10, and when light is incident to the second electrode 20, the anti-reflection layer may be disposed on one surface of the second electrode 20.

The anti-reflection layer may include, for example a material having a refractive index of about 1.6 to about 2.5, and may include for example at least one of metal oxide, metal sulfide, and an organic material having a refractive index within the ranges. The anti-reflection layer may include, for example a metal oxide such as aluminum-containing oxide, molybdenum-containing oxide, tungsten-containing oxide, vanadium-containing oxide, rhenium-containing oxide, niobium-containing oxide, tantalum-containing oxide, titanium-containing oxide, nickel-containing oxide, copper-containing oxide, cobalt-containing oxide, manganese-containing oxide, chromium-containing oxide, tellurium-containing oxide, or a combination thereof; metal sulfide such as zinc sulfide; or an organic material such as an amine derivative, but is not limited thereto.

In the photoelectric conversion device 100, when light enters from the first electrode 10 or the second electrode 20 and the photoelectric conversion layer 30 absorbs light in a predetermined wavelength spectrum, excitons may be produced therein. The excitons are separated into holes and electrons in the photoelectric conversion layer 30, and the separated holes are transported to an anode that is one of the first electrode 10 and the second electrode 20 and the separated electrons are transported to the cathode that is the other of the first electrode 10 and the second electrode 20 so as to flow a current.

Hereinafter, another example of the photoelectric conversion device according to some example embodiment is described.

Figure 2:
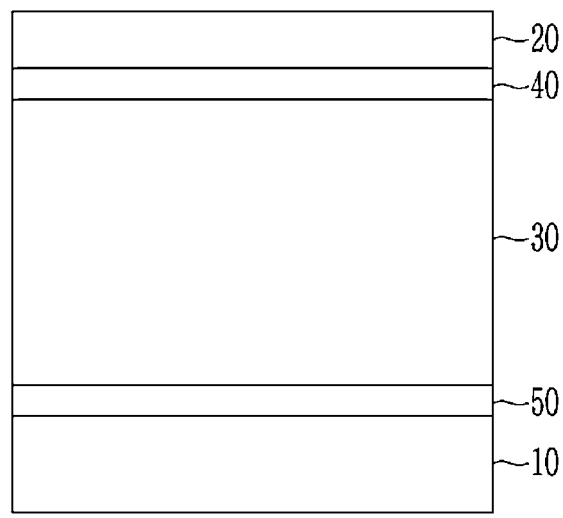
FIG. 2 is a cross-sectional view showing another example of a photoelectric conversion device according to example embodiments.

FIG. 2 is a cross-sectional view showing another example of a photoelectric conversion device according to example embodiments.

Referring to FIG. 2, a photoelectric conversion device 100 according to the present embodiment includes a first electrode 10, a second electrode 20, a photoelectric conversion layer 30, and a buffer layer 40, like the aforementioned embodiment.

However, the photoelectric conversion device 100 according to the present embodiment further includes an auxiliary layer 50 between the first electrode 10 and the photoelectric conversion layer 30, unlike the aforementioned embodiment. The auxiliary layer 50 may facilitate movement of the second charge (e.g., holes) separated from the photoelectric conversion layer 30 to increase efficiency.

The auxiliary layer 50 may include, for example, an organic material, an inorganic material, and/or an organic/inorganic material.

The auxiliary layer 50 may include, for example, a compound represented by Chemical Formula B-1 or B-2.

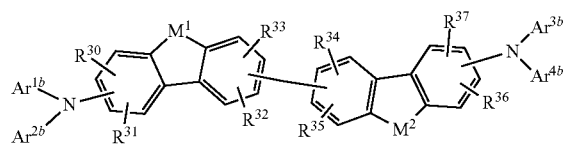

[Chemical Formula B-1]

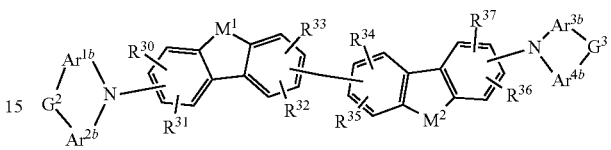

[Chemical Formula B-2]

In Chemical Formula B-1 or B-2, $M^1$ and $M^2$ may independently be $CR''R^o$, $SiR^pR^q$, $NR^r$, O, S, Se, or Te, $Ar^{1b}$, $Ar^{2b}$, $Ar^{3b}$, and $Ar^{4b}$ may independently be a substituted or unsubstituted C6 to C30 aryl group (arylene group) or a substituted or unsubstituted C3 to C30 heteroaryl group (heteroarylene group), $G^2$ and $G^3$ may independently be a single bond, —$(CR^sR^t)_{n3}$—, —O—, —S—, —Se—, —N=, —$NR^u$—, —$SiR^vR^w$—, or —$GeR^xR^y$—, wherein n3 is 1 or 2, and $R^{30}$ to $R^{37}$ and $R''$ to $R^y$ may independently be hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group.

The compound represented by Chemical Formula B-1 or B-2 may be, for example, a compound represented by Chemical Formula B-3 or B-4.

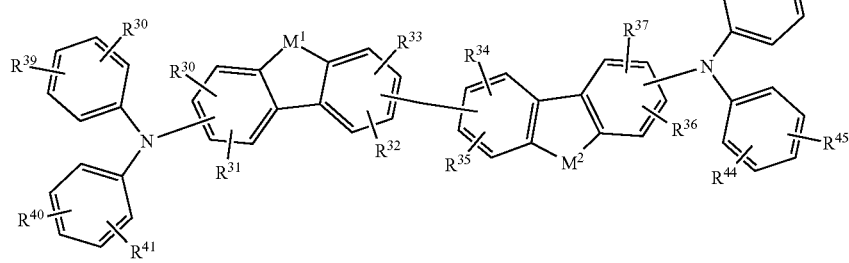

[Chemical Formula B-3]

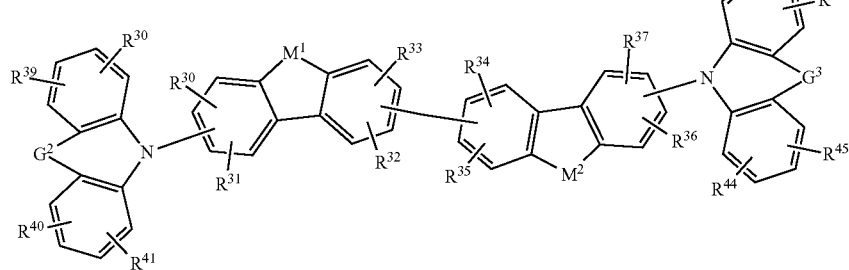

[Chemical Formula B-4]

In Chemical Formula B-3 or B-4, $M^1$, $M^2$, $G^2$, $G^3$, and $R^{30}$ to $R^{37}$ are the same as described above, and $R^{38}$ to $R^{45}$ may independently be hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

The compound represented by Chemical Formula B-3 or B-4 may be, for example, a compound represented by Chemical Formula B-5 or B-6.

[Chemical Formula B-5]

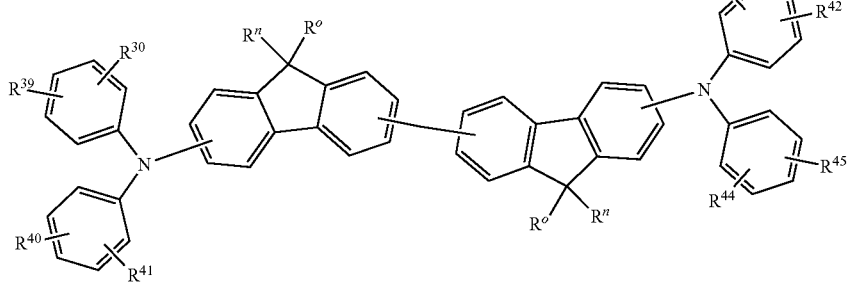

[Chemical Formula B-6]

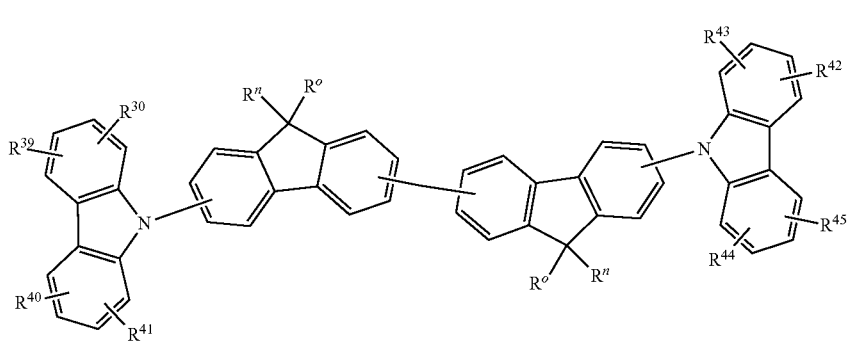

In Chemical Formula B-5 or B-6, $R^{38}$ to $R^{45}$ and $R^o$ and $R^n$ are the same as described above.

The auxiliary layer 50 may include, for example, a low molecular organic semiconductor, a polymer semiconductor, or a combination thereof which has high charge mobility, and thereby the charge mobility of the auxiliary layer 50 may be higher than the charge mobility of the aforementioned photoelectric conversion layer 30 described above. For example, the charge mobility of the auxiliary layer 50 may be about 50 times or more, about 70 times or more, about 80 times or more, about 100 times or more, about 120 times or more, about 150 times or more, about 200 times or more, about 300 times or more, about 500 times or more, about 800 times or more, or about 1000 times or more higher than that of the photoelectric conversion layer 30. For example, the charge mobility of the auxiliary layer 50 may be, for example, greater than or equal to about $1.0\times10^{-3}$ cm$^2$/Vs, for example, greater than or equal to about $1.2\times10^{-3}$ cm$^2$/Vs, greater than or equal to about $1.5\times10^{-3}$ cm$^2$/Vs, greater than or equal to about $1.8\times10^{-3}$ cm$^2$/Vs, greater than or equal to about $2.0\times10^{-3}$ cm$^2$/Vs, greater than or equal to about $3.0\times10^{-3}$ cm$^2$/Vs, greater than or equal to about $4.0\times10^{-3}$ cm$^2$/Vs, or greater than or equal to about $5.0\times10^{-3}$ cm$^2$/Vs. For example, the charge mobility of the auxiliary layer 50 may be, for example, about $1.0\times10^{-3}$ cm$^2$/Vs to about 10 cm$^2$/Vs, for example about $1.2\times10^{-3}$ cm$^2$/Vs to about 10 cm$^2$/Vs, about $1.5\times10^{-3}$ cm$^2$/Vs to about 10 cm$^2$/Vs, about $1.8\times10^{-3}$ cm$^2$/Vs to about 10 cm$^2$/Vs, about $2.0\times10^{-3}$ cm$^2$/Vs to about 10 cm$^2$/Vs, about $3.0\times10^{-3}$ cm$^2$/Vs to about 10 cm$^2$/Vs, about $4.0\times10^{-3}$ cm$^2$/Vs to about 10 cm$^2$/Vs, or about $5.0\times10^{-3}$ cm$^2$/Vs to about 10 cm$^2$/Vs.

For example, the auxiliary layer 50 may include a low molecular organic semiconductor having an average molecular weight of less than or equal to about 3000. For example, the auxiliary layer 50 may include an aromatic compound and/or a heteroaromatic compound, for example a fused polycyclic aromatic compound, a fused polycyclic heteroaromatic compound, or a combination thereof, for example a fused polycyclic aromatic compound such as pentacene and/or a fused polycyclic heteroaromatic compound including at least one of O, S, Se, Te, N, or a combination thereof, for example a fused polycyclic heteroaromatic compound including at least one S, Se, Te, or a combination thereof. For example, the auxiliary layer 50 may include a fused polycyclic aromatic compound and/or fused polycyclic heteroaromatic compound having a compact planar structure wherein four or more rings are fused with each other, for example a fused polycyclic aromatic compound and/or a fused polycyclic heteroaromatic compound wherein 5, 6, 7, 8, 9, 10, 11, or 12 rings are fused. For example, the auxiliary layer 50 may include a fused polycyclic aromatic compound and/or a fused polycyclic heteroaromatic compound including at least one benzene ring. For example, the auxiliary layer 50 may be a fused polycyclic heteroaromatic compound including at least one thiophene, selenophene, and/or tellurophene.

For example, the auxiliary layer 50 may include a compound including a carbazole moiety, for example, a compound including at least three carbazole moieties.

For example, the auxiliary layer 50 may include a compound represented by Chemical Formula C.

[Chemical Formula C]

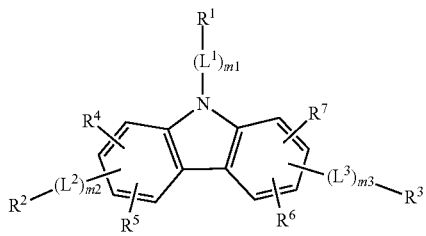

In Chemical Formula C,

L¹ to L³ may independently be a substituted or unsubstituted C6 to C20 arylene group, R¹ to R⁷ may independently be hydrogen, a substituted or unsubstituted C1 to C30 alkyl group, a substituted or unsubstituted C1 to C30 alkoxy group, a substituted or unsubstituted C6 to C20 aryl group, a substituted or unsubstituted C3 to C20 heteroaryl group, a substituted or unsubstituted carbazolyl group, a halogen, a cyano group, or a combination thereof, at least two of R¹ to R³ may include a substituted or unsubstituted carbazolyl group, and $m_1$ to $m_3$ may independently be 0 or 1.

For example, the auxiliary layer 50 may include a compound represented by one of Chemical Formulas C-1 to C-3.

[Chemical Formula C-1]

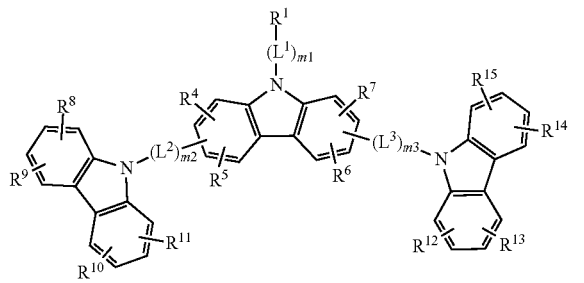

[Chemical Formula C-2]

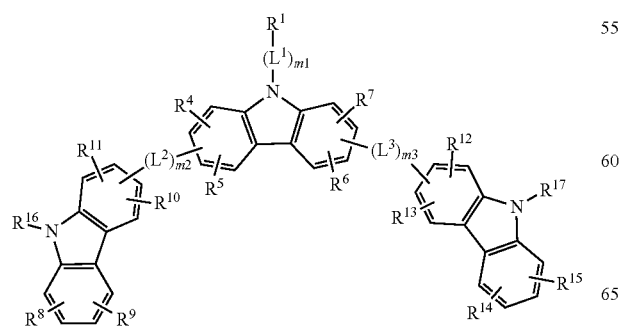

[Chemical Formula C-3]

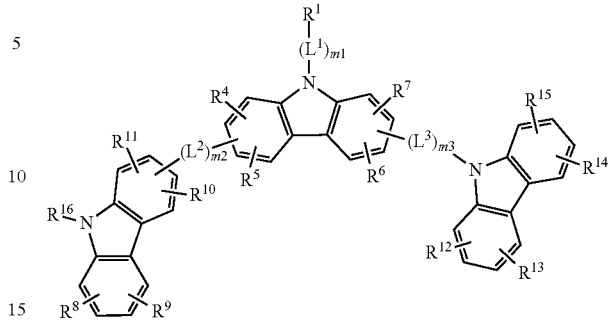

In Chemical Formulas C-1 to C-3,

L¹ to L³, R¹, R⁴ to R⁷, and $m_1$ to $m_3$ are the same as described above,

R⁸ to R¹⁷ may independently be hydrogen, a substituted or unsubstituted C1 to C30 alkyl group, a substituted or unsubstituted C1 to C30 alkoxy group, a substituted or unsubstituted C6 to C20 aryl group, a substituted or unsubstituted C3 to C20 heteroaryl group, a substituted or unsubstituted carbazolyl group, a halogen, a cyano group, or a combination thereof, and $m_1$ to $m_3$ may independently be 0 or 1.

For example, the auxiliary layer 50 may include a compound represented by any one of the following Chemical Formulas C-4 to C-7.

[Chemical Formula C-4]

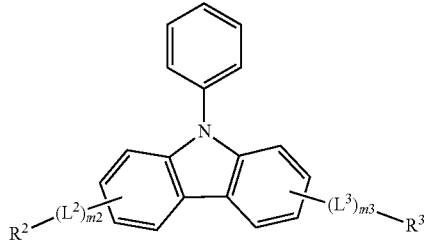

[Chemical Formula C-5]

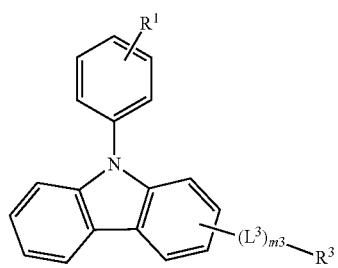

[Chemical Formula C-6]

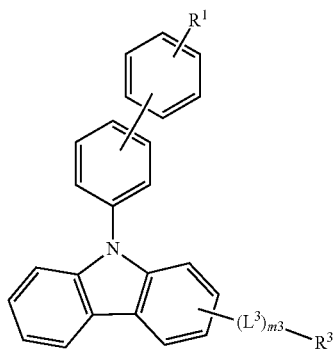

[Chemical Formula C-7]

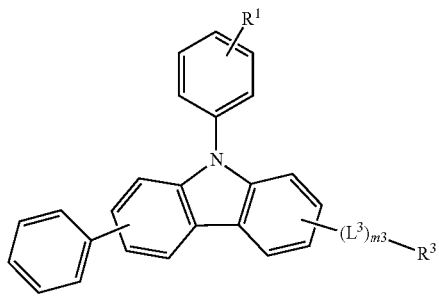

In Chemical Formulas C-4 to C-7, $L^1$ to $L^3$ may independently be a phenyl group, $m_1$ to $m_3$ may independently be 0 or 1, $R^1$ to $R^3$ may independently be a carbazolyl group or a phenyl-substituted carbazolyl group.

For example, the auxiliary layer 50 may include a compound represented by Chemical Formula C-8 or C-9.

[Chemical Formula C-8]

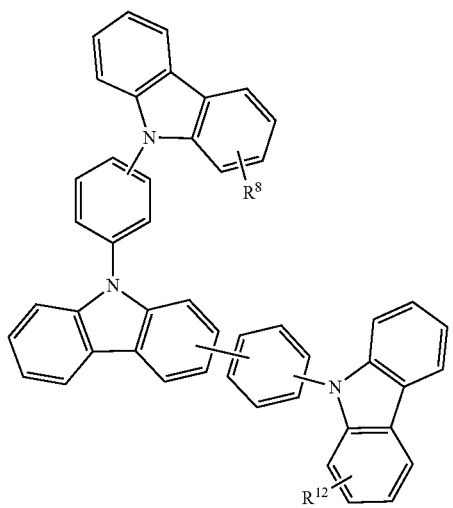

[Chemical Formula C-9]

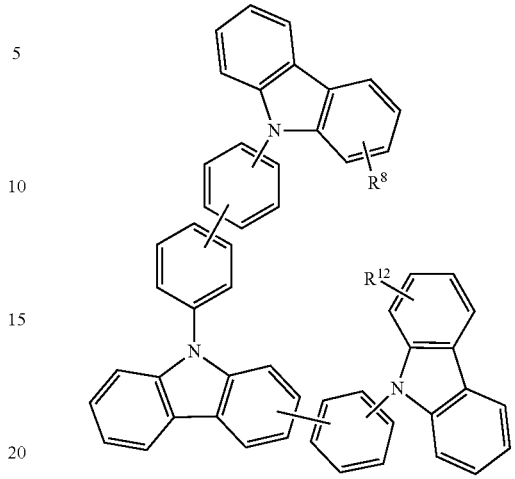

In Chemical Formula C-8 or C-9, $R^8$ and $R^{12}$ are independently hydrogen or a phenyl group.

The aforementioned photoelectric conversion device 100 may be applied to, for example, a sensor, and the sensor may be, for example, an image sensor. As described above, the image sensor including the photoelectric conversion device 100 may be applied as an image sensor suitable for high-speed shooting by having improved optical and electrical properties and reducing an after-image that is caused by remaining charges as described above.

Hereinafter, an example of the image sensor including the above-described device is described with reference to the drawings. Here, an organic CMOS image sensor is described as an example of the image sensor.

Figure 3:
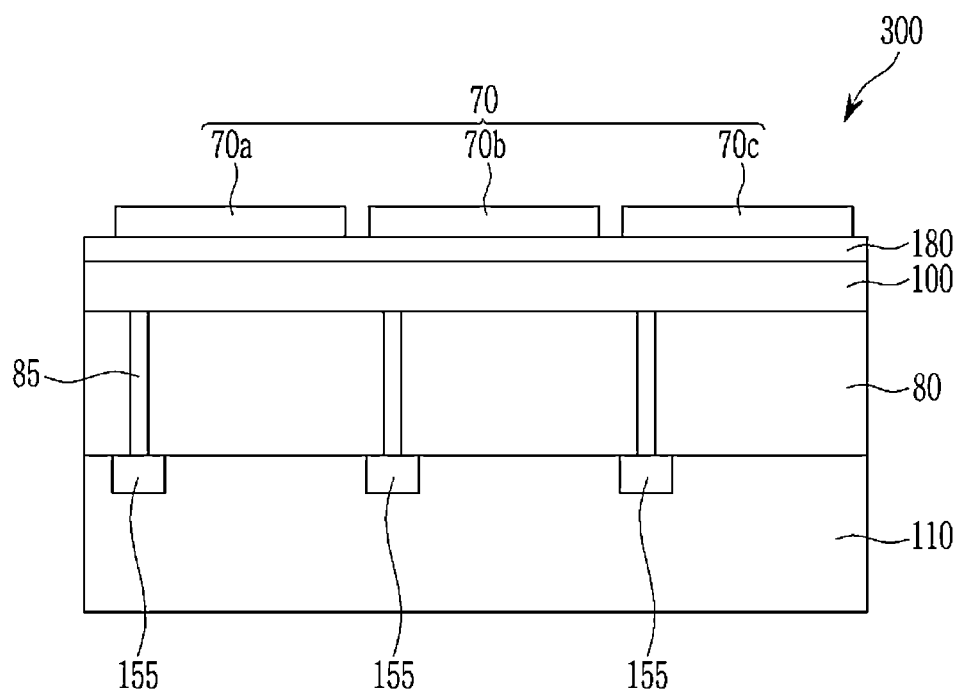
FIG. 3 is a cross-sectional view showing an example of an image sensor according to example embodiments.

FIG. 3 is a cross-sectional view showing an example of an image sensor according to example embodiments.

Referring to FIG. 3, the image sensor 300 according to some example embodiments includes a semiconductor substrate 110, an insulation layer 80, a photoelectric conversion device 100, and a color filter layer 70.

The semiconductor substrate 110 may be a silicon substrate, and is integrated with the transmission transistor (not shown) and the charge storage 155. The transmission transistor and/or the charge storage 155 may be integrated in each pixel. The charge storage 155 is electrically connected to the photoelectric conversion device 100.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto.

The insulation layer 80 is formed on the metal wire and the pad. The insulation layer 80 may be made of an inorganic insulating material such as a silicon oxide and/or a silicon nitride, or a low dielectric constant (low K) material such as SiC, SiCOH, SiCO, and SiOF. The insulation layer 80 has a trench 85 exposing the charge storage 155. The trench 85 may be filled with fillers.

The photoelectric conversion device 100 is formed on the insulation layer 80. The photoelectric conversion device 100 may have a structure shown in FIG. 1 or 2, and detailed description is the same as described above. One of the first electrode 10 and the second electrode 20 of the photoelectric conversion device 100 may be a light-receiving electrode and the other of the first electrode 10 and the second electrode 20 of the photoelectric conversion device 100 may be connected to the charge storage 155. For example, the second electrode 20 of the photoelectric conversion device 100 may be a light-receiving electrode, and the first electrode 10 of the photoelectric conversion device 100 may be connected to the charge storage 155.

The color filter layer 70 is formed on the photoelectric conversion device 100. The color filter layer 70 includes a blue filter 70a formed in a blue pixel, a red filter 70b formed in a red pixel, and a green filter 70c formed in a green pixel. However, the color filter layer 70 may include a cyan filter, a magenta filter, and/or a yellow filter, instead of the above color filters or may further include them in addition to the above color filters.

An insulation layer 180 is formed between the photoelectric conversion device 100 and the color filter layer 70. The insulation layer 180 may be omitted.

Focusing lens (not shown) may be further formed on the color filter layer 70. The focusing lens may control a direction of incident light and gather the light in one region. The focusing lens may have a shape of, for example, a cylinder or a hemisphere, but is not limited thereto.

Figure 4:
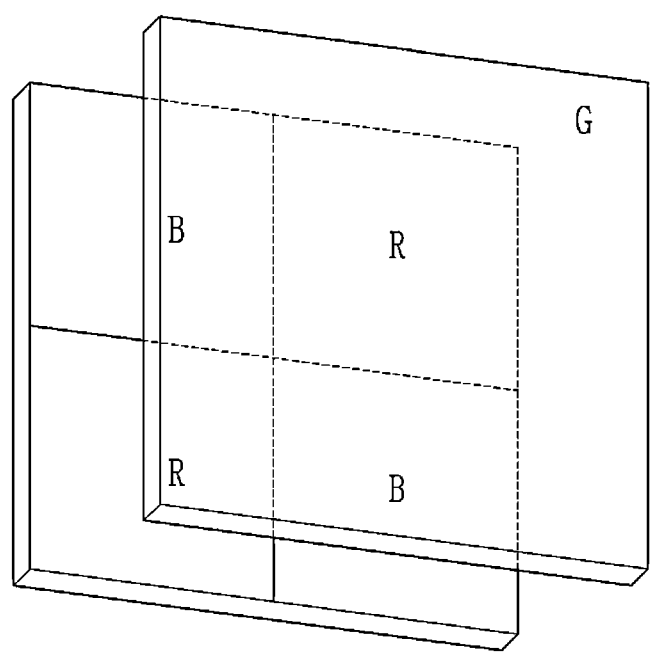
FIG. 4 is a top plan view showing an example of an image sensor according to example embodiment.
Figure 5:
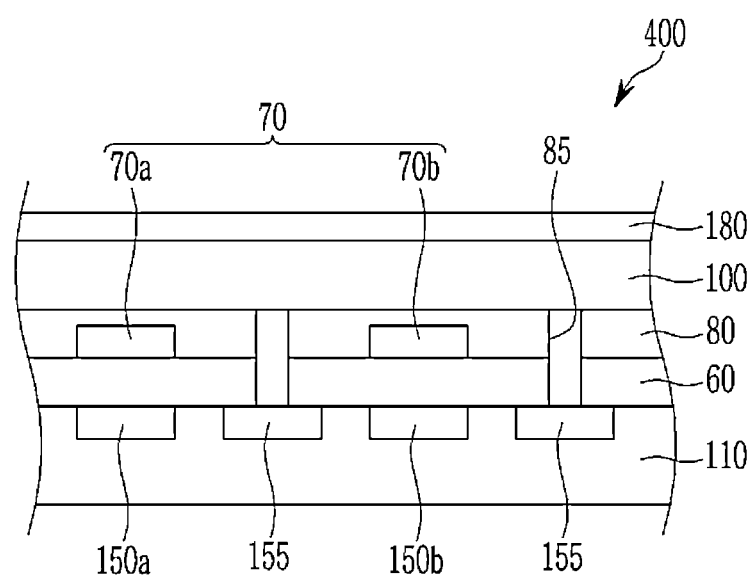
FIG. 5 is a cross-sectional view showing an example of the image sensor of FIG. 4.

FIG. 4 is a top plan view showing an example of an image sensor according to example embodiment and FIG. 5 is a cross-sectional view showing an example of the image sensor of FIG. 4.

Referring to FIGS. 4 and 5, the image sensor 400 according to some example embodiments includes a semiconductor substrate 110 integrated with photo-sensing devices 150a and 150b, a transfer transistor (not shown), and a charge storage 155; a lower insulation layer 60; a color filter layer 70; an upper insulation layer 80; and the aforementioned photoelectric conversion device 100.

The semiconductor substrate 110 may be a silicon substrate, and is integrated with the photo-sensing devices 150a and 150b, the transmission transistor (not shown), and the charge storage 155. The photo-sensing devices 150a and 150b may be photodiodes.

The photo-sensing devices 150a and 150b, the transfer transistor, and/or the charge storage 155 may be integrated in each pixel. For example, as shown in the drawing, the photo-sensing devices 150a and 150b may be included in a blue pixel and a red pixel and the charge storage 155 may be included in a green pixel.

The photo-sensing devices 150a and 150b may sense light, the information sensed by the photo-sensing devices may be transferred by the transmission transistor, the charge storage 155 is electrically connected to the photoelectric conversion device 100, and the information of the charge storage 155 may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto. Further, it is not limited to the structure, and the metal wire and pad may be disposed under the photo-sensing devices 150a and 150b.

The lower insulation layer 60 is formed on the metal wire and the pad. The lower insulation layer 60 may be made of an inorganic insulating material such as a silicon oxide and/or a silicon nitride, or a low dielectric constant (low K) material such as SiC, SiCOH, SiCO, and SiOF. The lower insulation layer 60 has a trench exposing the charge storage 155. The trench may be filled with fillers.

The color filter layer 70 is formed on the lower insulation layer 60. The color filter layer 70 includes a blue filter 70a formed in a blue pixel and a red filter 70b in a red pixel. However, it may include a cyan filter, a magenta filter, and/or a yellow filter instead of the above color filters or may further include them in addition to the above color filters. In the present embodiment, a green filter is not included, but a green filter may be further included.

The upper insulation layer 80 is formed on the color filter layer 70. The upper insulation layer 80 may eliminate a step caused by the color filter layer 70 and smoothen the surface. The upper insulation layer 80 and the lower insulation layer 60 may include a contact hole (not shown) exposing a pad, and a trench 85 exposing the charge storage 155 of a green pixel.

The photoelectric conversion device 100 is formed on the upper insulation layer 80. The photoelectric conversion device 100 may have a structure shown in FIG. 1 or 2, and detailed descriptions therefor are the same as described above. One of the first electrode 10 and the second electrode 20 of the photoelectric conversion device 100 may be a light-receiving electrode and the other of the first electrode 10 and the second electrode 20 of the photoelectric conversion device 100 may be connected to the charge storage 155. For example, the second electrode 20 of the photoelectric conversion device 100 may be a light-receiving electrode, and the first electrode 10 of the photoelectric conversion device 100 may be connected to the charge storage 155.

Focusing lens (not shown) may be further formed on the photoelectric conversion device 100. The focusing lens may control a direction of incident light and gather the light in one region. The focusing lens may have a shape of, for example, a cylinder or a hemisphere, but is not limited thereto.

Figure 6:
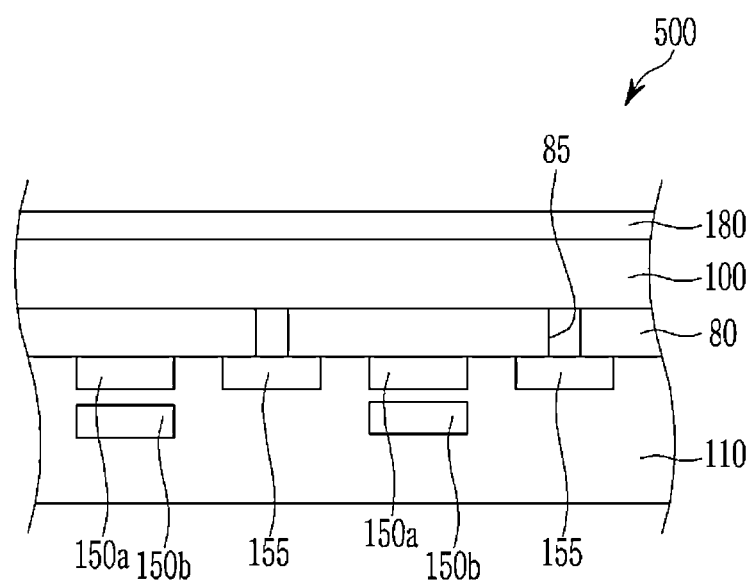
FIG. 6 is a cross-sectional view showing another example of the image sensor of FIG. 4.

FIG. 6 is a cross-sectional view showing another example of the image sensor of FIG. 4.

Referring to FIG. 6, the image sensor 500 according to some example embodiments includes a semiconductor substrate 110 integrated with photo-sensing devices 150a and 150b, a transmission transistor (not shown), and a charge storage 155, a lower insulation layer 60, a color filter layer 70, an upper insulation layer 80, and a photoelectric conversion device 100, like the aforementioned embodiment.

However, in the image sensor 500 according to the present embodiment, the photo-sensing devices 150a and 150b are stacked in a vertical direction, and the color filter layer 70 is omitted, unlike the aforementioned embodiment. The photo-sensing devices 150a and 150b are electrically connected to a charge storage (not shown) and may be transferred by a transfer transistor. The photo-sensing devices 150a and 150b may selectively absorb light in each wavelength spectrum depending on a stacking depth.

The photoelectric conversion device 100 may have a structure shown in FIG. 1 or 2, and detailed descriptions therefor are the same as described above. One of the first electrode 10 and the second electrode 20 of the photoelectric conversion device 100 may be a light-receiving electrode and the other of the first electrode 10 and the second electrode 20 of the photoelectric conversion device 100 may be connected to the charge storage 155. For example, the second electrode 20 of the photoelectric conversion device 100 may be a light-receiving electrode, and the first electrode 10 of the photoelectric conversion device 100 may be connected to the charge storage 155.

Figure 7:
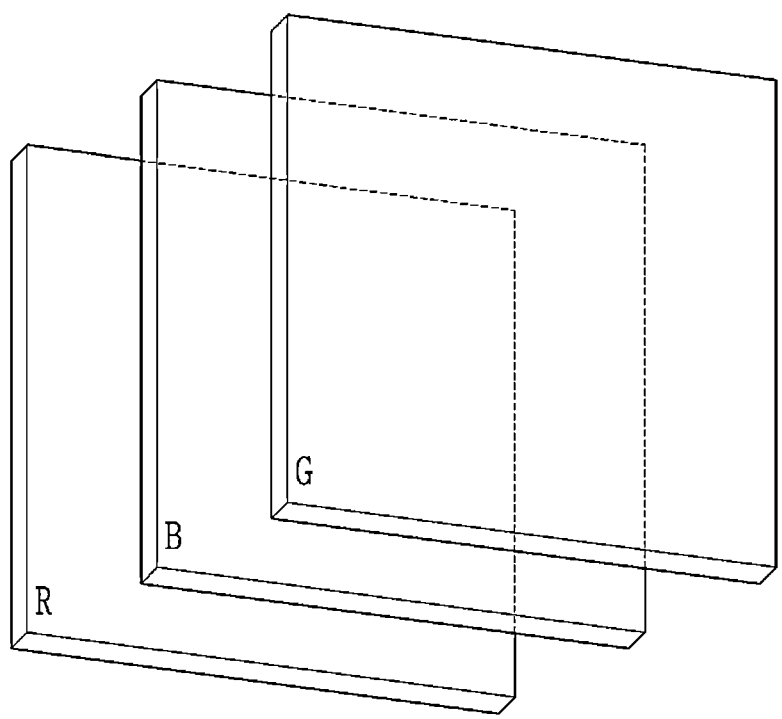
FIG. 7 is a top plan view showing another example of an image sensor according to example embodiments.
Figure 8:
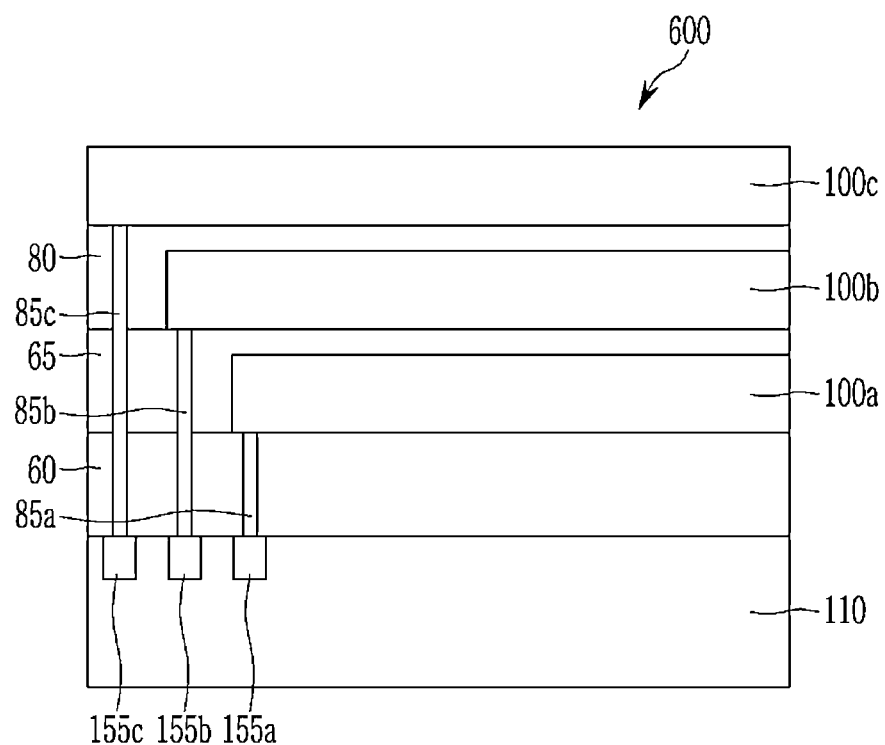
FIG. 8 is a cross-sectional view showing an example of the image sensor of FIG. 7.

FIG. 7 is a top plan view showing another example of an image sensor according to example embodiment, and FIG. 8 is a cross-sectional view showing an example of the image sensor of FIG. 7.

The image sensor 600 according to the present embodiment has a structure in which a green device configured to selectively absorb light in a green wavelength spectrum, a blue device configured to selectively absorb light in a blue wavelength spectrum, and a red device configured to selectively absorb light in a red wavelength spectrum are stacked.

The organic sensor 600 according to the present embodiment includes a semiconductor substrate 110, a lower insulation layer 60, an intermediate insulation layer 65, an upper insulation layer 80, a first photoelectric conversion device 100a, a second photoelectric conversion device 100b, and a third photoelectric conversion device 100c.

The semiconductor substrate 110 may be a silicon substrate, and is integrated with the transmission transistor (not shown) and the charge storages 155a, 155b, and 155c.

A metal wire (not shown) and a pad (not shown) are formed on the semiconductor substrate 110, and a lower insulation layer 60 is formed on the metal wire and the pad.

The first photoelectric conversion device 100a, the second photoelectric conversion device 100b, and the third photoelectric conversion device 100c are sequentially formed on the lower insulation layer 60.

The first, second, and third photoelectric conversion devices 100a, 100b, and 100c may independently have the structures shown in FIG. 1 or 2, and detailed descriptions are the same as described above. One of the first electrode 10 and the second electrode 20 of the first, second, and third photoelectric conversion devices 100a, 100b, and 100c may be a light-receiving electrode and the other of the first electrode 10 and the second electrode 20 of the first, second, and third photoelectric conversion devices 100a, 100b, and 100c may be connected to the charge storages 155a, 155b, and 155c.

The first photoelectric conversion device 100a may selectively absorb light in a wavelength range of red, blue, and green to perform photoelectric conversion. For example, the first photoelectric conversion device 100a may be a red photoelectric conversion device. The intermediate insulation layer 65 may be formed on the first photoelectric conversion device 100a.

The second photoelectric conversion device 100b may be formed on the intermediate insulation layer 65.

The second photoelectric conversion device 100b may selectively absorb light in a wavelength range of red, blue, and green to perform photoelectric conversion. For example, the first photoelectric conversion device 100b may be a blue photoelectric conversion device.

The upper insulation layer 80 may be formed on the second photoelectric conversion device 100b. The lower insulation layer 60, the intermediate insulation layer 65, and the upper insulation layer 80 have a plurality of trenches 85a, 85b, and 85c exposing the charge storages 155a, 155b, and 155c.

The third photoelectric conversion device 100c is formed on the upper insulation layer 80. The third photoelectric conversion device 100c may selectively absorb light in a wavelength range of red, blue, and green to perform photoelectric conversion. For example, the third photoelectric conversion device 100c may be a green photoelectric conversion device.

Focusing lens (not shown) may be further formed on the photoelectric conversion device 100c. The focusing lens may control a direction of incident light and gather the light in one region. The focusing lens may have a shape of, for example, a cylinder or a hemisphere, but is not limited thereto.

In the drawing, the first photoelectric conversion device 100a, the second photoelectric conversion device 100b, and the third photoelectric conversion device 100c are sequentially stacked, but the present disclosure is not limited thereto, and they may be stacked in various orders.

As described above, the first photoelectric conversion device 100a, the second photoelectric conversion device 100b, and the third photoelectric conversion device 100c are stacked, and thus the size of an image sensor may be reduced to realize a down-sized image sensor.

Figure 9:
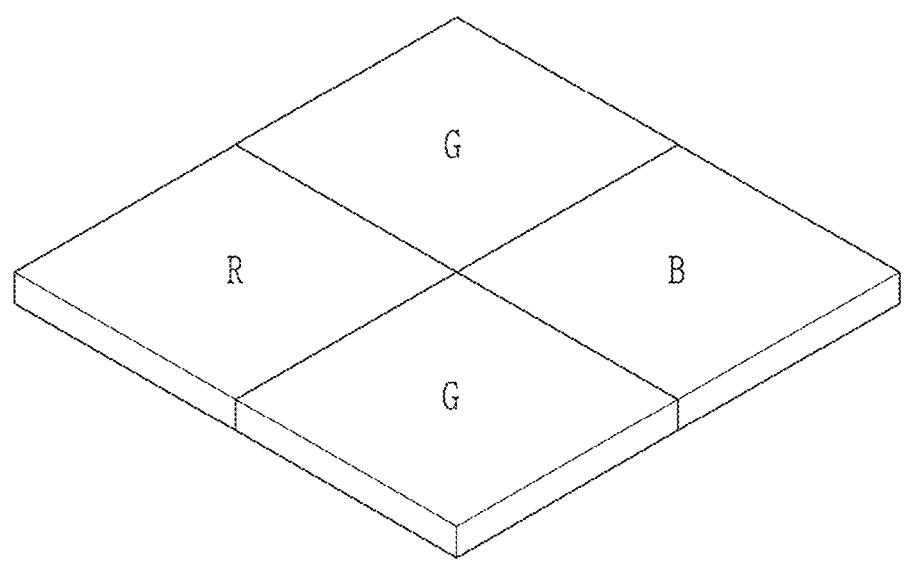
FIG. 9 is a top plan view showing another example of an image sensor according to example embodiments.
Figure 10:
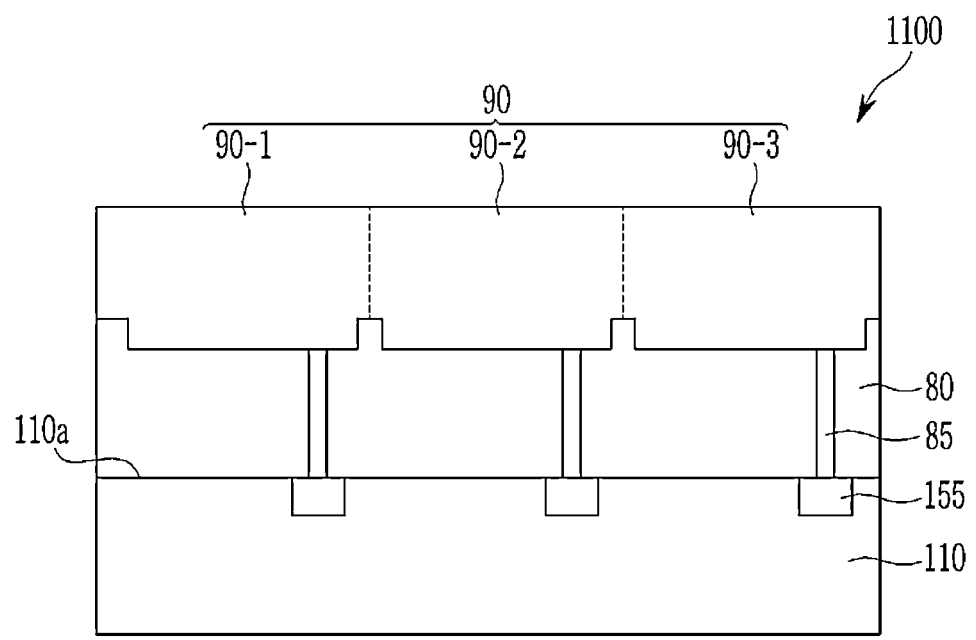
FIG. 10 is a cross-sectional view showing an example of the image sensor of FIG. 9.

FIG. 9 is a top plan view showing another example of an image sensor according to example embodiments, and FIG. 10 is a cross-sectional view showing an example of the image sensor of FIG. 9.

Referring to FIGS. 9 and 10, the image sensor 1100 includes a photoelectric conversion device 90 on a semiconductor substrate 110, and the photoelectric conversion device 90 includes a plurality of photoelectric conversion devices 90-1, 90-2, and 90-3. The plurality of photoelectric conversion devices 90-1, 90-2, and 90-3 may convert light in different wavelength spectra (e.g., blue light, green light, or red light) into electric signals. Referring to FIG. 10, the plurality of photoelectric conversion device 90-1, 90-2, and 90-3 are horizontally aligned side by side in a horizontal direction on the semiconductor substrate 110 and partially or totally overlapped with each other in an extended direction on the surface 110a of the semiconductor substrate 110. Each photoelectric conversion device 90-1, 90-2, and 90-3 is connected to charge storages 155 integrated in the semiconductor substrate 110 through trenches 85.

Each photoelectric conversion device 90-1, 90-2, and 90-3 may be one of the photoelectric conversion devices 100 and 200. For example, two or more photoelectric conversion devices 90-1, 90-2, and 90-3 may include different portions of a common continuous layer continuously that extends continuously between the photoelectric conversion devices 90-1, 90-2, and 90-3. For example, the plurality of photoelectric conversion devices 90-1, 90-2, and 90-3 may share a common first electrode 10 and/or a common second electrode 20. For example, two or more photoelectric conversion devices 90-2, 90-2, and 90-3 may have each different photoelectric conversion layer 30 absorbing light in different wavelength spectra of the incident light. Other structures of the image sensor 1100 may be the same as one or more of the image sensors described with reference to FIGS. 3 to 8.

Figure 11:
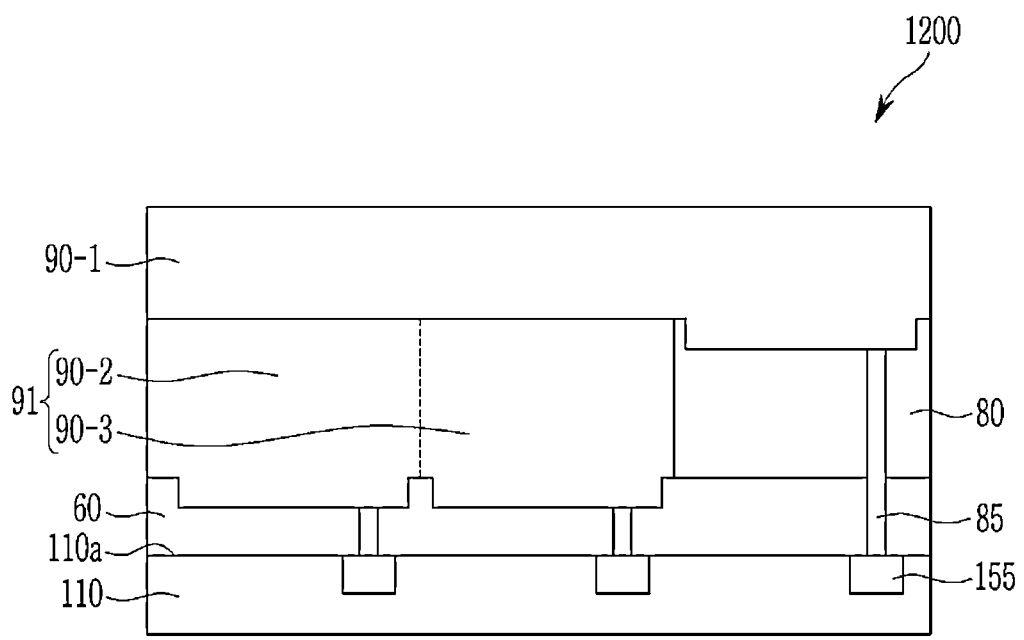
FIG. 11 is a cross-sectional view showing an example of an image sensor according to example embodiments.

FIG. 11 is a cross-sectional view showing an example of an image sensor according to example embodiments.

Referring to FIG. 11, the image sensor 1200 includes a semiconductor substrate 110 and photoelectric conversion devices 90-1 and 91 on the semiconductor substrate 110. The photoelectric conversion device 91 includes a plurality of photoelectric conversion devices 90-2 and 90-3, and the plurality of photoelectric conversion devices 90-2 and 90-3 are aligned side by side and overlapped with each other on the surface 110a of the semiconductor substrate 110. The plurality of photoelectric conversion devices 90-1, 90-2, and 90-3 may photoelectrically convert light in different wavelength spectra (e.g., blue light, green light, or red light) into electric signals.

For example, the photoelectric conversion device 90-1 may include a plurality of photoelectric conversion devices horizontally aligned and thus absorbing light in different wavelength spectra. For example, the photoelectric conversion device 91 may photoelectrically convert light in one wavelength spectrum which is selected from the blue light, the green light, and the red light. For example, the photoelectric conversion device 91 may be totally or partially overlapped with the photoelectric conversion device 90-1. Other structures of the image sensor 1200 may be the same as one or more of the image sensors described with reference to FIGS. 3 to 8.

Figure 12:
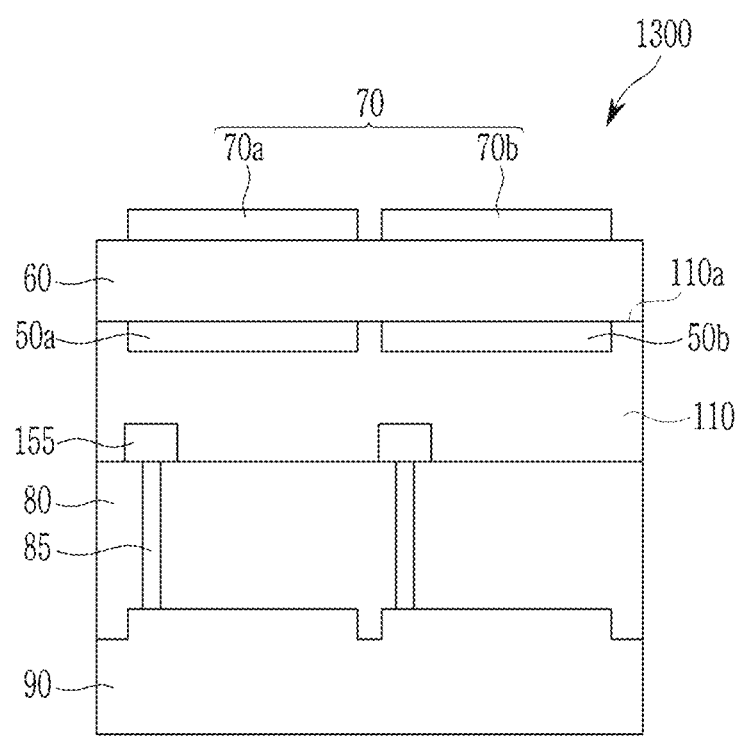
FIG. 12 is a cross-sectional view showing another example of an image sensor according to example embodiments.

FIG. 12 is a cross-sectional view showing another example of an image sensor according to example embodiments.

Referring to FIG. 12, the image sensor 1300 includes a semiconductor substrate 110 integrated with photo-sensing devices 50a and 50b, a transmission transistor (not shown), and charge storages 155; an upper insulation layer 80 and a color filter layer 70 disposed on the semiconductor substrate 110; a lower insulation layer 60 and a photoelectric conversion device 90 under the semiconductor substrate 110. The color filter layer 70 may include a blue filter 70a and a red filter 70b, but example embodiments are not limited thereto and the color filter layer 70 may include other colors. The photoelectric conversion device 90 may be the aforementioned photoelectric conversion devices 100 and 200. In FIG. 12, since the photoelectric conversion device 90 is disposed under the semiconductor substrate 110, the photoelectric conversion device 90 and the color filter layer 70 may be separately disposed in the photo-sensing devices 150a and 150b. Other structures of the image sensor 1300 may be the same as one or more of the image sensors described with reference to FIGS. 3 to 8.

Figure 13A:
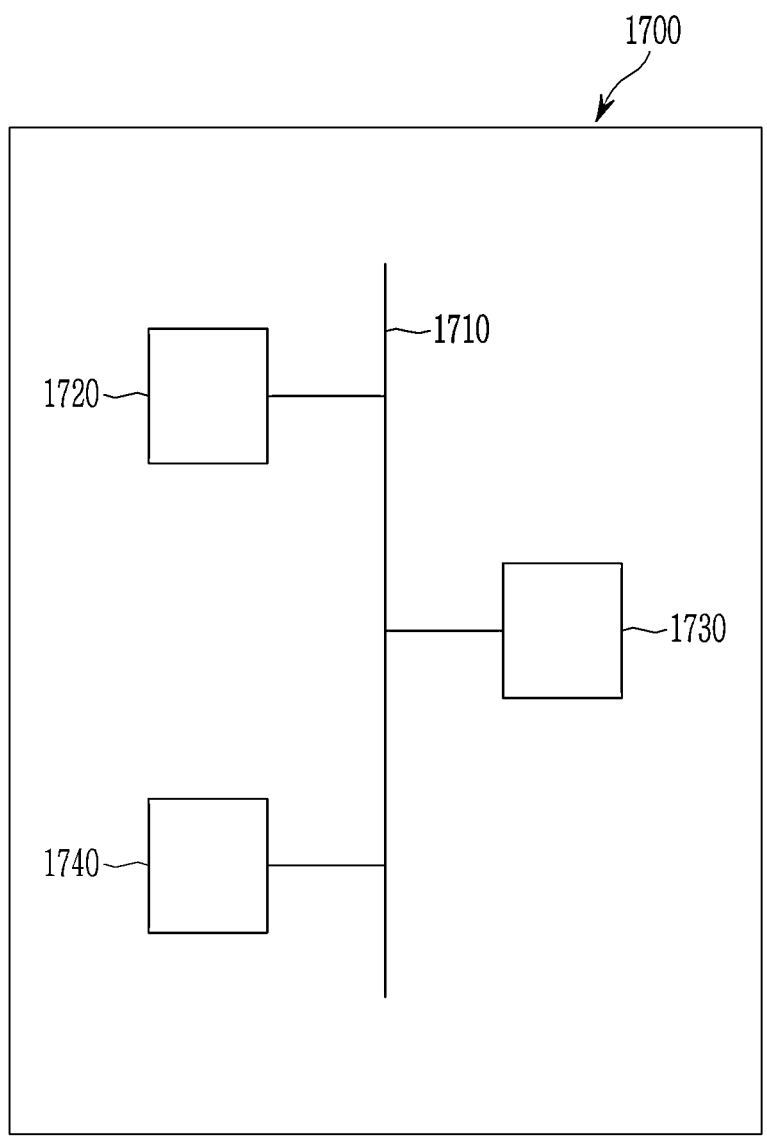
FIG. 13A is a schematic diagram of an electronic device according to example embodiments.
Figure 13B:
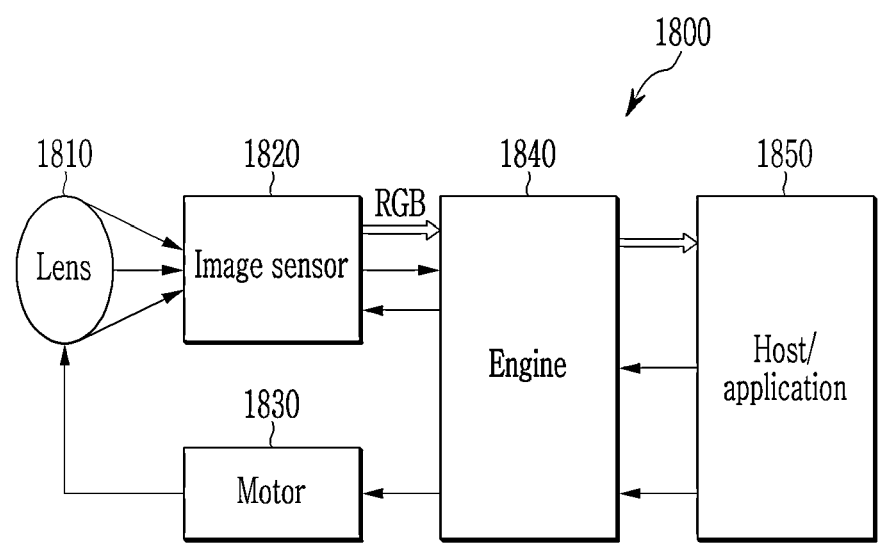
FIG. 13B is a block diagram of a digital camera including an image sensor according to an embodiment.

The aforementioned photoelectric conversion device and sensor may be applied to various electronic devices, for example mobile phones, cameras (as depicted in FIG. 13B), biometric devices, and/or automotive electronic components, but is not limited thereto.

FIG. 13A is a schematic diagram of an electronic device according to example embodiment.

Referring to FIG. 13A, an electronic device 1700 may include a processor 1720, a memory 1730, and an image sensor 1740 that are electrically coupled together via a bus 1710. The image sensor 1740 may be any one according to the above-described embodiments. The memory 1730, which may be a non-transitory computer readable medium, may store a program of instructions. The memory 1730 may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM). The processor 1720 may execute the stored program of instructions to perform one or more functions. For example, the processor 1720 may be configured to process electric signals generated by the organic sensor 1740. The processor 1720 may be configured to generate an output (e.g., an image to be displayed on a display interface) based on such as processing.

FIG. 13B is a block diagram of a digital camera including an image sensor according to an embodiment.

Referring to FIG. 13B, a digital camera 1800 includes a lens 1810, an image sensor 1820, a motor 1830, and an engine 1840. The image sensor 1820 may be one according to one of the aforementioned embodiments.

The lens 1810 concentrates incident light on the image sensor 1820. The image sensor 1820 generates RGB data for received light through the lens 1810. In some embodiments, the image sensor 1820 may interface with the engine 1840. The motor 1830 may adjust the focus of the lens 1810 or perform shuttering in response to a control signal received from the engine 1840. The engine 1840 may control the image sensor 1820 and the motor 1830. The engine 1840 may be connected to a host/application 1850.

In example embodiments, the processor 1720 of FIG. 13A, motor 1830 of FIG. 13B, engine 1840 of FIG. 13B, and host/application 1850 of FIG. 13B may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Hereinafter, the embodiments are illustrated in more detail with reference to examples. However, these examples are non-limiting examples, and the present disclosure is not limited thereto.

Measurement and Evaluation

An HOMO energy level is evaluated by irradiating UV light to thin films with AC-2 (Hitachi High Tech, Inc.) or AC-3 (Riken Keiki Co., Ltd. and measuring amounts of photoelectrons emitted depending on energy, and LUMO energy levels of the thin films are evaluated by obtaining energy bandgaps with a UV-Vis spectrometer (UV-3600 Plus, Shimadzu Corp.) and then, using the energy bandgaps and the measured HOMO energy levels.

Preparation of Materials

SYNTHESIS EXAMPLE 2.00 g (4.96 mmol) of 5-(10H-phenoselenazin-10-yl)selenophene-2-carbaldehyde is suspended in ethanol, and 1.07 g (5.46 mmol) of 1H-cyclopenta[b]naphthalene-1,3(2H)dione (HanChEM Products Corp.) is added thereto. Subsequently, the mixture is reacted at 50° C. for 2 hours. Then, the resultant is cooled down to room temperature and vacuum-filtered, and a solid obtained therefrom is separated and purified through silica gel column chromatography (eluent: methylenechloride:ethylacetate) and recrystallized by using a mixed solvent of chloroform/hexane to obtain a red solid of Compound A. A yield thereof is 83%.

$^1$H NMR ppm (DMSO-d6, dimethyl sulfoxide-d6) 8.34 (s)-1H, 8.32 (s)-1H, 8.27 (s)-1H, 8.24-8.16 (m)-3H, 7.98 (dd)-2H, 7.88 (dd)-2H, 7.71 (m) 2H, 7.61 (t)-2H, 7.45 (t)-2H, 6.61 (d)-1H.

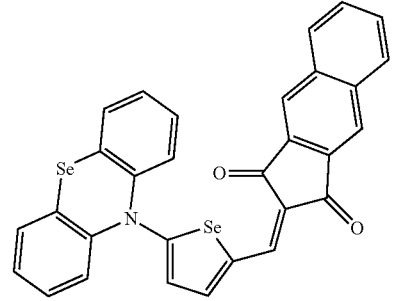

[Compound A]

Preparation of Thin Film

Preparation Example 1

Compound B (first material, BCP, Sigma-Aldrich Co., Ltd.) (HOMO: 6.4 eV, LUMO: 2.8 eV) and fullerene (second material, C60, Frontier Carbon Corp.) (HOMO: 6.3 eV, LUMO: 4.0 eV) are co-deposited in a volume ratio of 50:50 on a glass substrate to form a 100 nm-thick thin film.

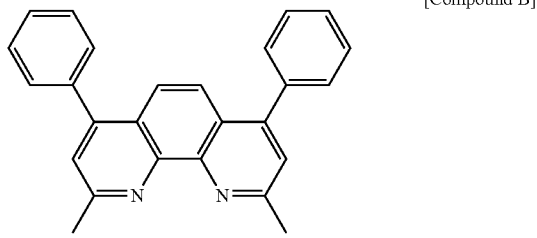

[Compound B]

Comparative Preparation Example 1

Compound B (first material:second material=100:0) alone is deposited on a glass substrate to form a 100 nm-hick thin film.

Comparative Preparation Example 2

Fullerene C60 (first material:second material=0:100) alone is deposited on a glass substrate to form a 100 nm-thick thin film.

Evaluation I

The surface morphology of the thin films according to the Preparation Example and Comparative Preparation Examples are evaluated.

Surface morphologies of the thin films are examined by using an atomic force microscope (AFM, Veeco Instruments Inc.).

Figure 14:
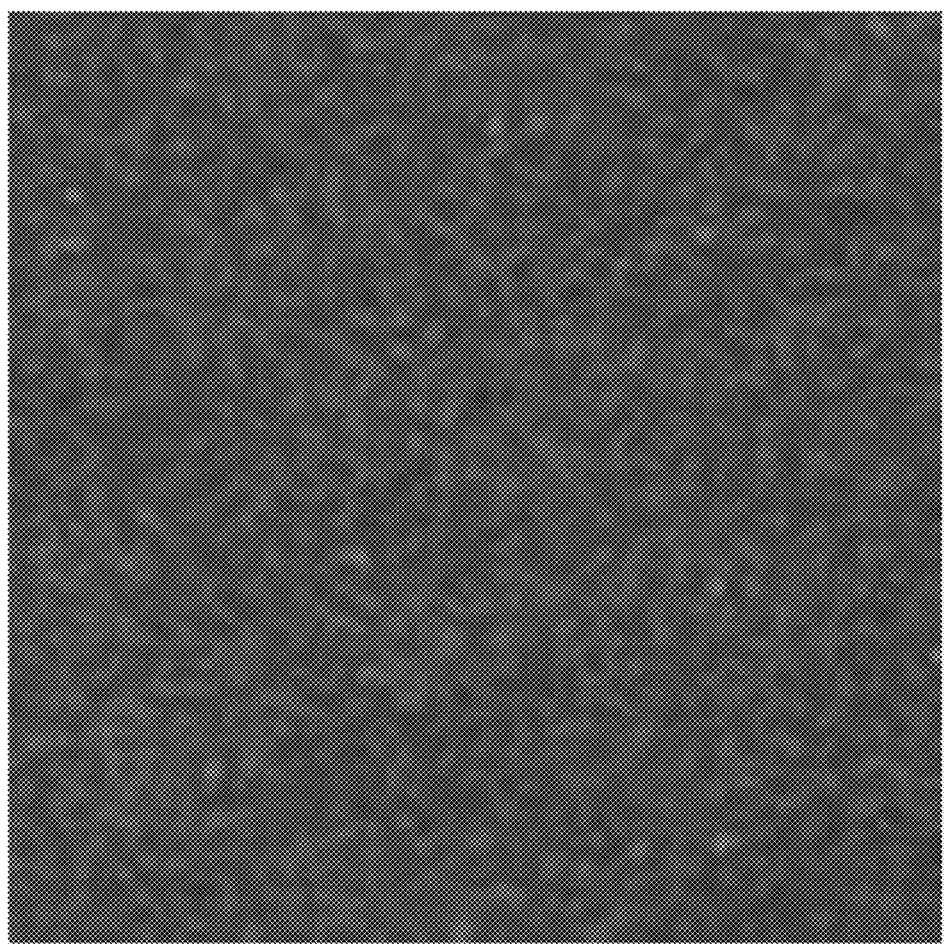
FIG. 14 is a photograph showing the surface morphology of the thin film according to Preparation Example 1.
Figure 15:
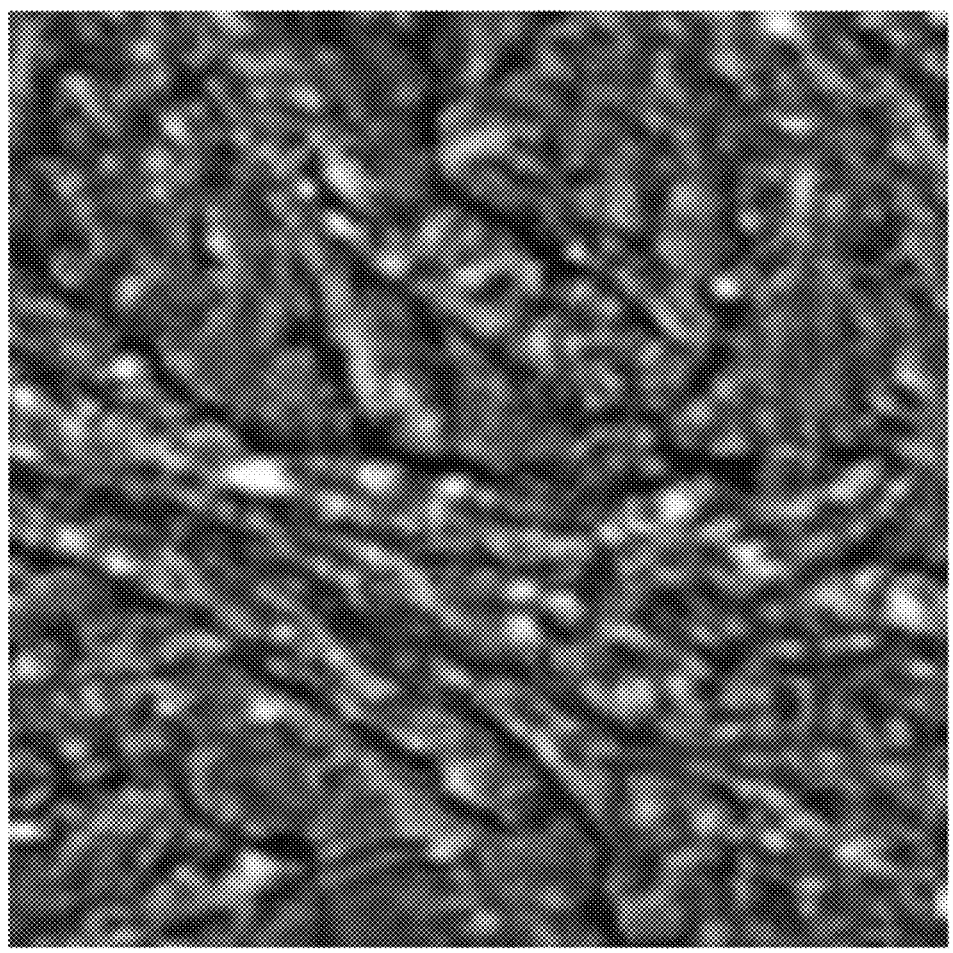
FIG. 15 is a photograph showing the surface morphology of the thin film according to Comparative Preparation Example 1.
Figure 16:
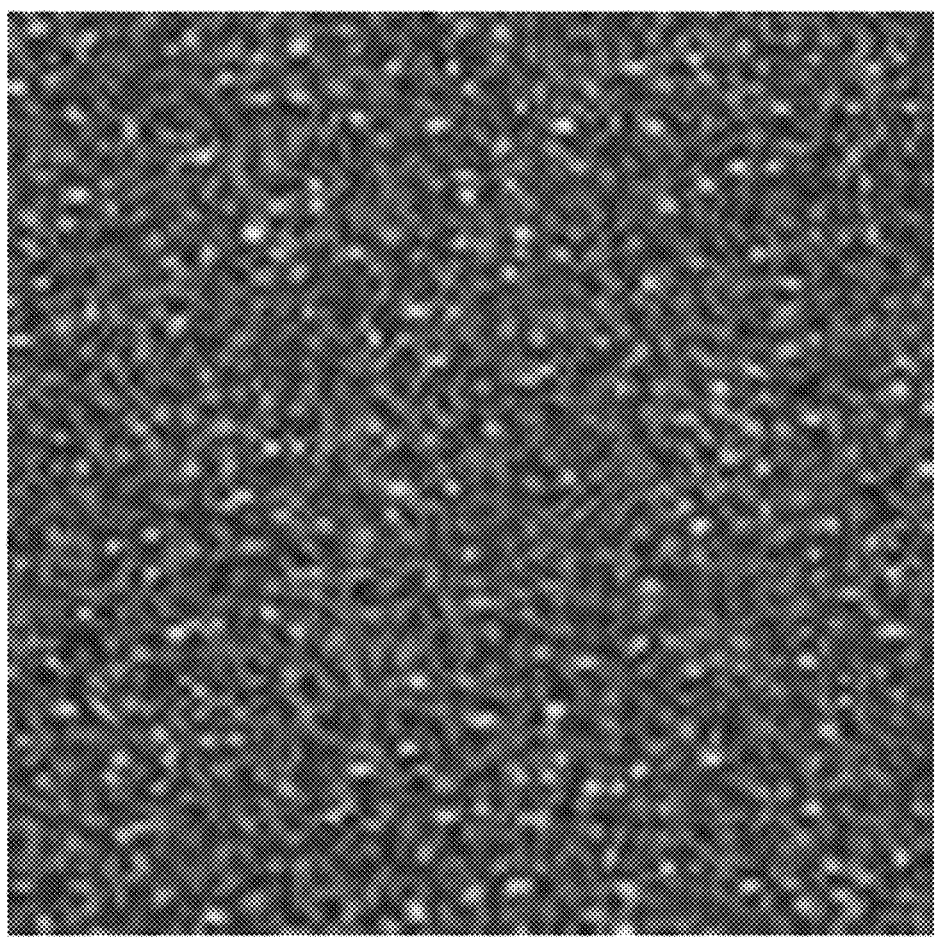
FIG. 16 is a photograph showing the surface morphology of the thin film according to Comparative Preparation Example 2.

The results are shown in FIGS. 14 to 16 and Table 1.

FIG. 14 is a photograph showing the surface morphology of the thin film according to the Preparation Example, FIG. 15 is a photograph showing the surface morphology of the thin film according to Comparative Preparation Example 1, and FIG. 16 is a photograph showing the surface morphology of the thin film according to Comparative Preparation Example 2.

TABLE 1

|  | Surface Roughness (RMS, nm) |
|---|---|
| Preparation Example 1 | 0.67 |
| Comparative Preparation Example 1 | 15.3 |
| Comparative Preparation Example 2 | 1.39 |

Referring to Table 1 and FIGS. 14 to 16, the thin film of the Preparation Example exhibits improved surface morphology compared with the thin films of Comparative Preparation Examples.

Evaluation II

Atom structures of the thin films of the Preparation Example and Comparative Preparation Examples are evaluated.

The atom structures of the surfaces of the thin films are examined by using a transmission electron microscope (TEM, Tecnai G2ST).

Figure 17:
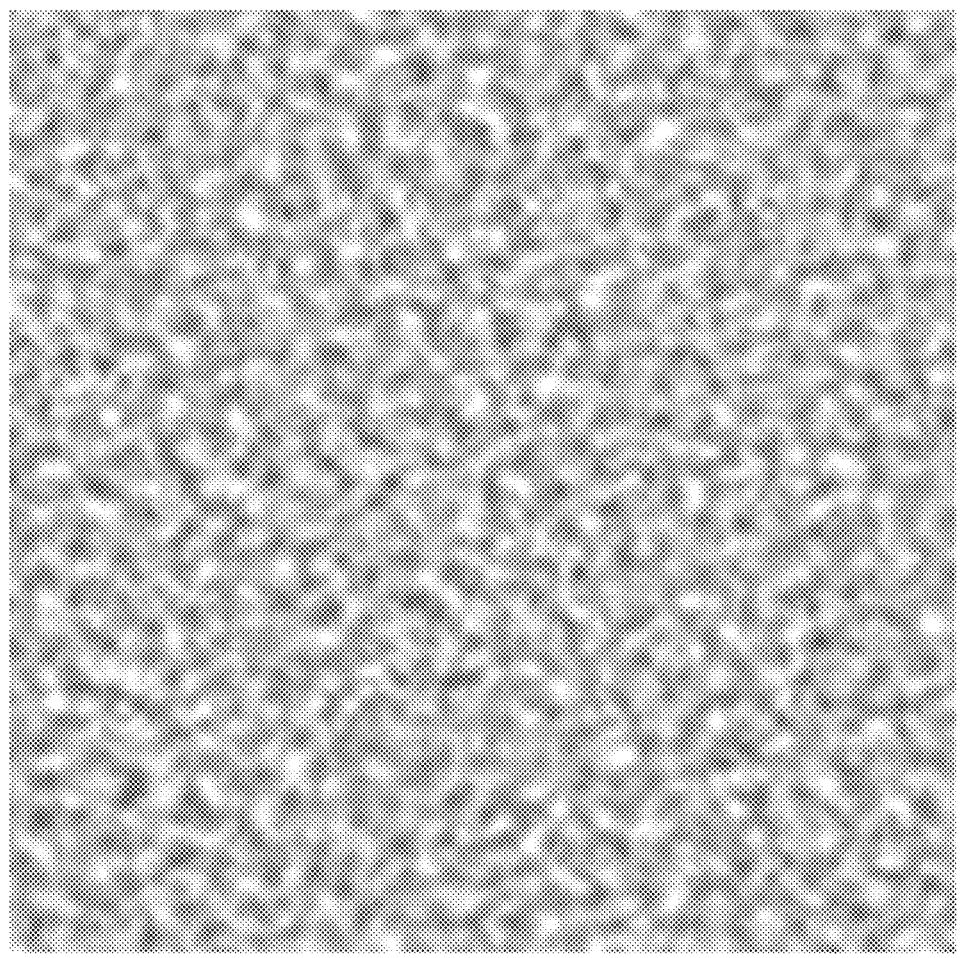
FIG. 17 is a photograph showing the atomic structure of a thin film according to Preparation Example 1.
Figure 18:
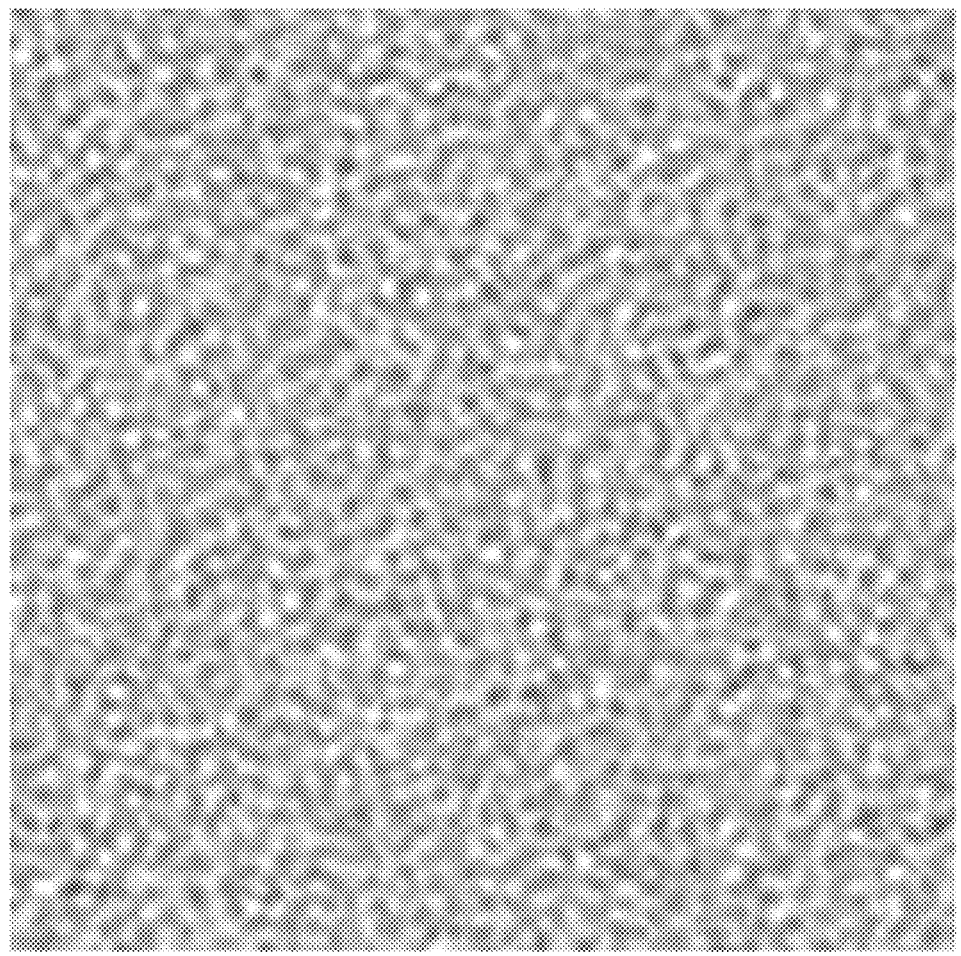
FIG. 18 is a photograph showing the atomic structure of a thin film according to Comparative Preparation Example 1.
Figure 19:
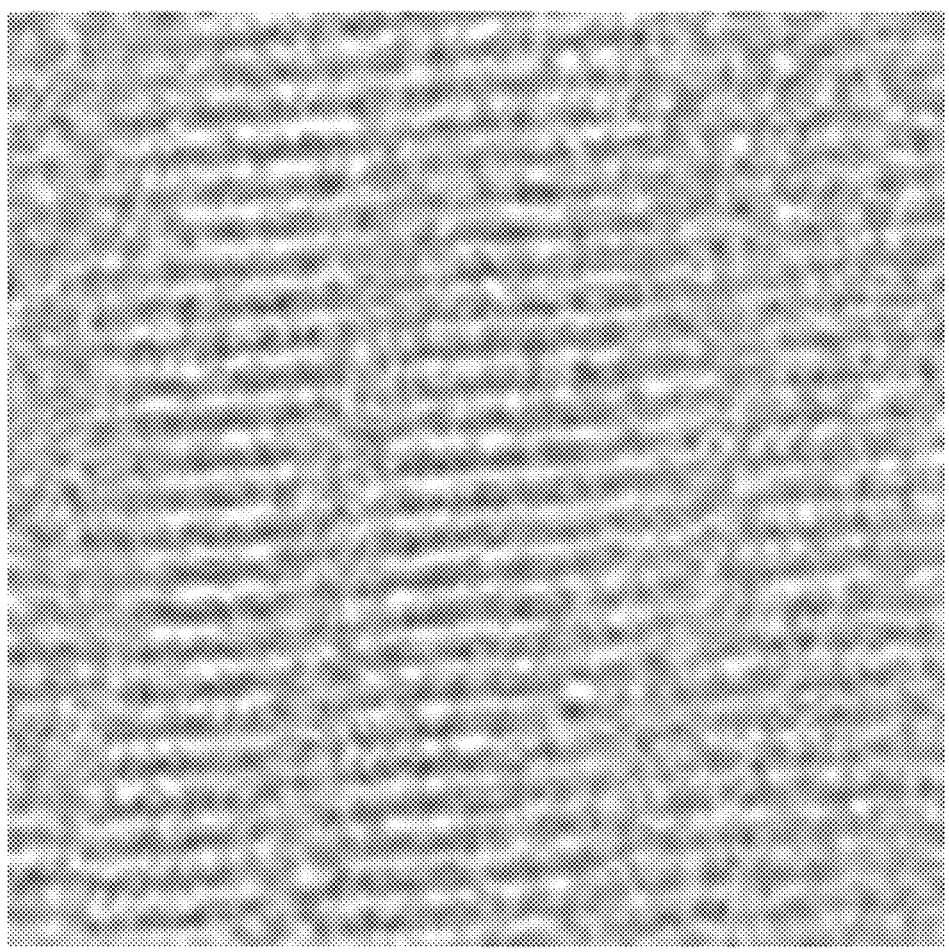
FIG. 19 is a photograph showing the atomic structure of a thin film according to Comparative Preparation Example 2.

The results are shown in FIGS. 17 to 19.

FIG. 17 is a photograph showing the atomic structure of a thin film according to the Preparation Example, FIG. 18 is a photograph showing the atomic structure of a thin film according to Comparative Preparation Example 1, and FIG. 19 is a photograph showing the atomic structure of a thin film according to Comparative Preparation Example 2.

Referring to FIGS. 17 to 19, the thin film of the Preparation Example has an amorphous structure unlike the thin film of Comparative Preparation Example 2.

Evaluation III

Optical properties of the thin films of the Preparation Example and Comparative Preparation Examples are evaluated.

The optical properties are measured by using a UV-Vis spectrometer.

The results are shown in FIGS. 20A to 20D.

Figure 20A:
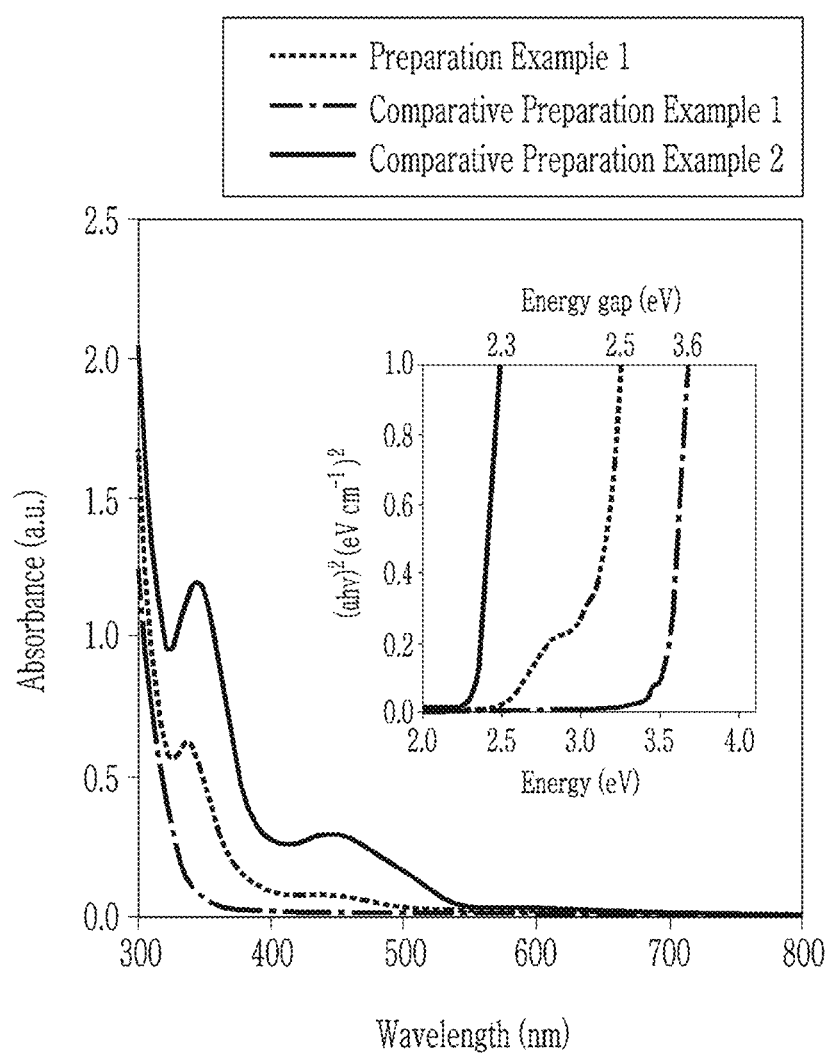
FIG. 20A is a graph showing optical properties of thin films according to Preparation Example 1 and Comparative Preparation Examples 1 and 2.
Figure 20B:
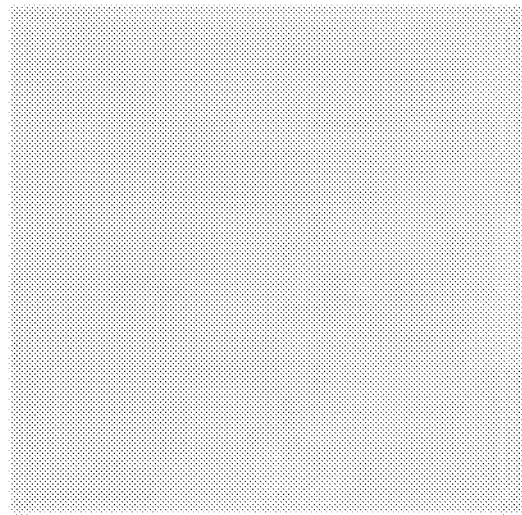
FIGS. 20B, 20C and 20D are photographs showing a transparence of the thin films according to Comparative Preparation Example 1, Preparation Example 1, and Comparative Preparation Example 2, respectively.
Figure 20C:
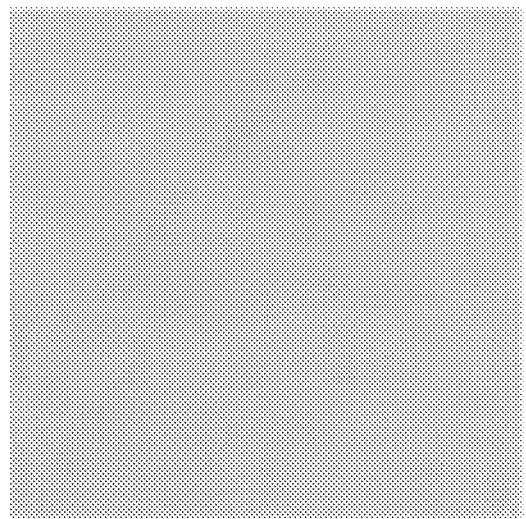
Figure 20D:
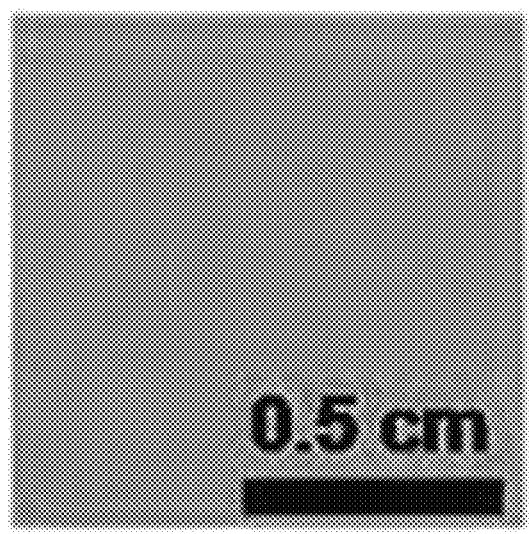

FIG. 20A is a graph showing optical properties of thin films according to Preparation Example 1 and Comparative Preparation Examples 1 and 2, and FIGS. 20B, 20C and 20D are photographs showing a transparence of the thin films according to Comparative Preparation Example 1, Preparation Example 1, and Comparative Preparation Example 2, respectively.

Referring to FIGS. 20A to 20D, the thin film of the Preparation Example exhibits greatly decreased absorbance in a visible region (e.g., about 400 nm to about 700 nm) compared with the thin film ($\lambda_{max}$=447 nm) of Comparative Preparation Example 2.

The results of FIGS. 20A to 20D and Relationship Equation are used to obtain energy bandgaps.

$$(\varepsilon h\nu)=C(h\nu-Eg)^n$$ [Relationship Equation]

In Relationship Equation, C is a constant number, $\varepsilon$ is a molar extinction coefficient, Eg is an average energy bandgap, and n may be determined by a transition type, for example, ½.

When the n is ½, the results are shown in Table 2.

TABLE 2

|  | Energy Bandgap (Eg, eV) |
|---|---|
| Preparation Example 1 | 2.5 |
| Comparative Preparation Example 1 | 3.6 |
| Comparative Preparation Example 2 | 2.3 |

Referring to FIGS. 20A to 20D and Table 2, the energy bandgap of the thin film of Preparation Example is between the energy bandgap of the thin film of Comparative Preparation Example 1 and the energy bandgap of the thin film of Comparative Preparation Example 2 and thus may be controlled by mixing the first material and the second material, and accordingly, transparency of the thin films may be controlled by color tuning.

Evaluation IV

Electrical characteristics of the thin films of the Preparation Example and the Comparative Preparation Examples are evaluated.

The electrical characteristics of the thin films are evaluated by radiating UV into the thin films under an atmospheric pressure with AC-3 (Riken Keiki Co., Ltd.) and thus obtaining the HOMO energy levels from amounts of photoelectrons emitted depending on energy.

The results are shown in Table 3.

TABLE 3

|  | HOMO energy level (eV) |
|---|---|
| Preparation Example 1 | 6.4 |
| Comparative Preparation Example 1 | 6.4 |
| Comparative Preparation Example 2 | 6.3 |

Manufacture of Photoelectric Conversion Device

Example 1

ITO (WF: 4.7 eV) is sputtered on a glass substrate to form a 150 nm-thick anode. Subsequently, on the anode, Compound A according to the Synthesis Example (HOMO: 5.6 eV, LUMO: 3.5 eV) as a p-type semiconductor and fullerene (C60, Frontier Carbon Corp.) (HOMO: 6.3 eV, LUMO: 4.0 eV) as an N-type semiconductor are co-deposited in a volume ratio (a thickness ratio) of 1:1 to form a 100 nm-thick photoelectric conversion layer (HOMO: 5.7 eV, LUMO: 3.7 eV). On the photoelectric conversion layer, Compound B (first material, BCP, Sigma-Aldrich Co., Ltd.) (HOMO: 6.4 eV, LUMO: 2.8 eV) and fullerene (second material, C60, Frontier Carbon Corp.) (HOMO: 6.3 eV, LUMO: 4.0 eV) are co-deposited in a volume ratio of 1:1 to form a 15 nm-thick buffer layer (HOMO: 6.4 eV, LUMO: 3.9 eV). On the buffer layer, ITO is sputtered to form a 7 nm-thick cathode (WF: 4.7 eV). On the cathode, aluminum oxide ($Al_2O_3$) is atomic layer-deposited to form a 40 nm-thick anti-reflection layer, and a glass plate is used for sealing to manufacture a photoelectric conversion device. Each layer is thermally deposited under high vacuum of less than $10^{-7}$ Torr.

Comparative Example 1

A photoelectric conversion device is manufactured according to the same method as Example 1 except that the buffer layer is not formed.

Comparative Example 2

A photoelectric conversion device is manufactured according to the same method as Example 1 except that Compound B alone is deposited to form a 15 nm-thick buffer layer (HOMO: 6.4 eV, LUMO: 2.8 eV).

Comparative Example 3

A photoelectric conversion device is manufactured according to the same method as Example 1 except that fullerene C60 alone is deposited to form a 15 nm-thick buffer layer (HOMO: 6.3 eV, LUMO: 4.0 eV).

Evaluation V

Photoelectric conversion efficiencies of the photoelectric conversion devices according to Example and Comparative Examples are evaluated.

The photoelectric conversion efficiency may be evaluated from external quantum efficiency (EQE), which may be evaluated by external quantum efficiency (EQE) at a peak absorption wavelength ($\lambda_{max}$), in a wavelength spectrum of 400 nm to 720 nm in an Incident Photon to Current Efficiency (IPCE) method.

Figure 21:
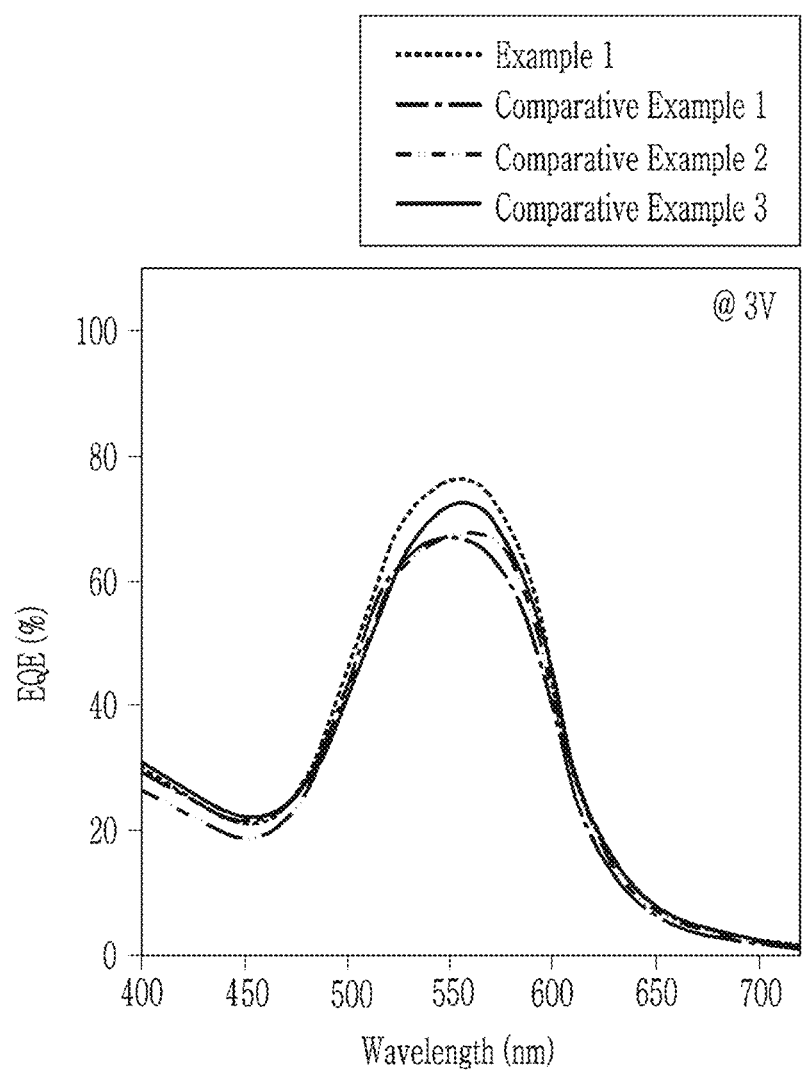
FIG. 21 is a graph showing photoelectric conversion efficiency of photoelectric conversion devices according to Example 1 and Comparative Examples 1 to 3.

The results are shown in FIG. 21.

FIG. 21 is a graph showing photoelectric conversion efficiency of photoelectric conversion devices according to Example 1 and Comparative Examples 1 to 3.

Referring to FIG. 21, the photoelectric conversion device of Example exhibits improved photoelectric conversion efficiency in a green wavelength spectrum, compared with the photoelectric conversion devices of Comparative Examples.

Evaluation VI

The current characteristics of the photoelectric conversion devices according to Example and Comparative Examples are evaluated.

Figure 22:
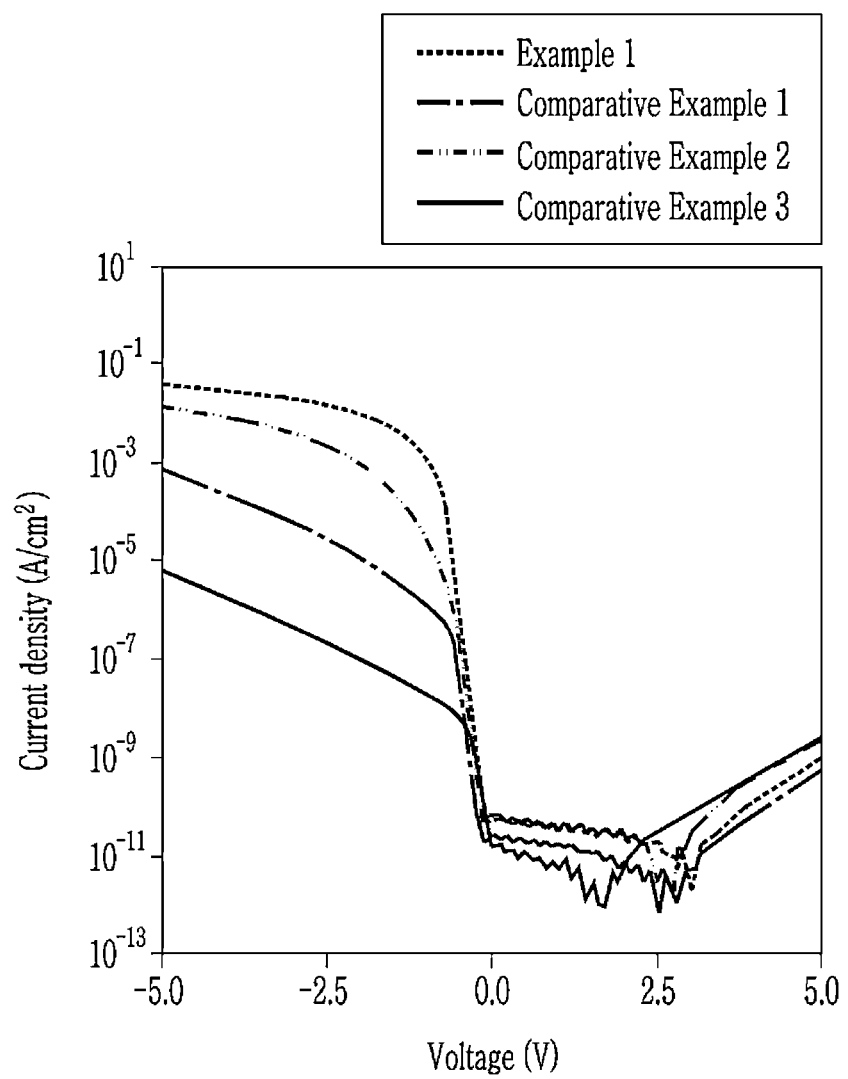
FIG. 22 is a graph showing current characteristics of photoelectric conversion devices according to Example 1 and Comparative Examples 1 to 3.

The results are shown in FIG. 22.

FIG. 22 is a graph showing current characteristics of photoelectric conversion devices according to Example 1 and Comparative Examples 1 to 3.

Referring to FIG. 22, the photoelectric conversion devices of Example exhibits a high current ratio ($I_{on}/I_{off}$, $J_{on@-3V}/J_{off@+3V}$), compared with the photoelectric conversion devices of Comparative Examples.

Evaluation VII

Photoelectric conversion efficiency of the photoelectric conversion devices of Example and Comparative Examples depending on an external electric field is evaluated.

Figure 23:
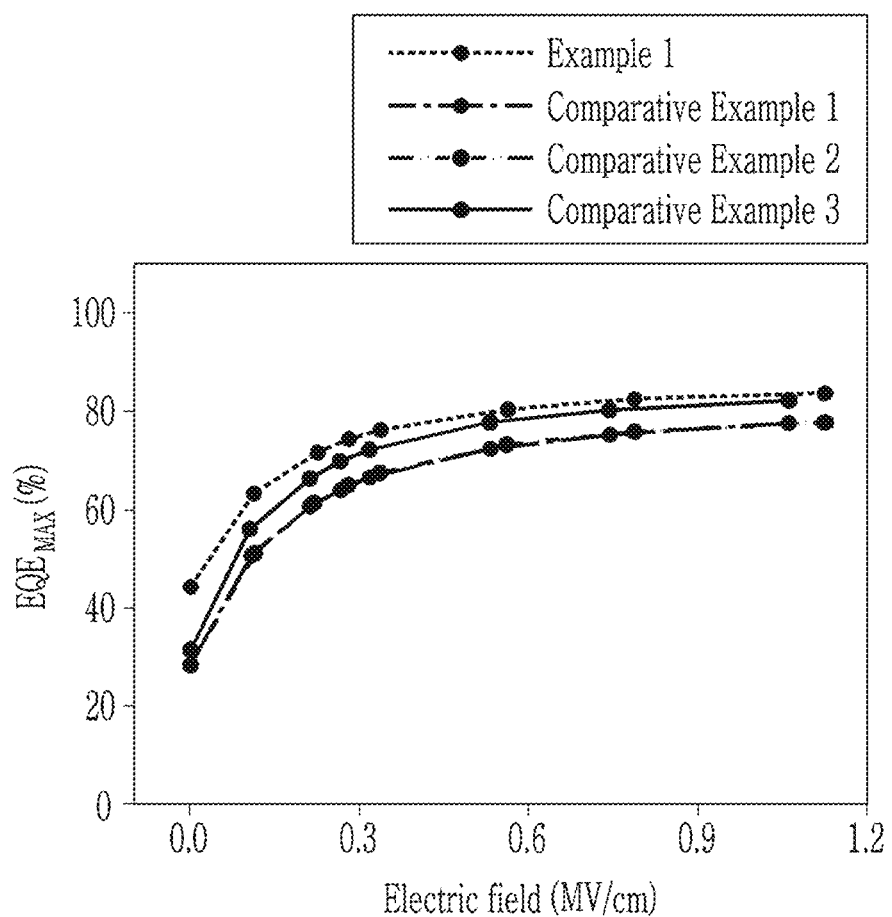
FIG. 23 is a graph showing changes in photoelectric conversion efficiency depending on electric fields of the photoelectric conversion devices according to Example 1 and Comparative Examples 1 to 3.

FIG. 23 is a graph showing changes in photoelectric conversion efficiency depending on electric fields of the photoelectric conversion devices according to Example 1 and Comparative Examples 1 to 3.

Referring to FIG. 23, the photoelectric conversion device of Example exhibits high photoelectric conversion efficiency, compared with the photoelectric conversion devices of Comparative Examples.

Evaluation VIII

Thermal resistance properties of the photoelectric conversion devices of Example and Comparative Examples are evaluated.

The thermal resistance properties are evaluated by using external quantum efficiency changes of the photoelectric conversion devices of Example and Comparative Examples depending on a temperature, when annealed at room temperature (about 25° C.) up to 150° C. (by 5 minutes at each temperature) or external quantum efficiency changes of the photoelectric conversion devices of Example and Comparative Examples depending on a temperature when annealed at 150° C. for 120 minutes.

The results are shown in FIGS. 24 and 25A to 25C.

Figure 24:
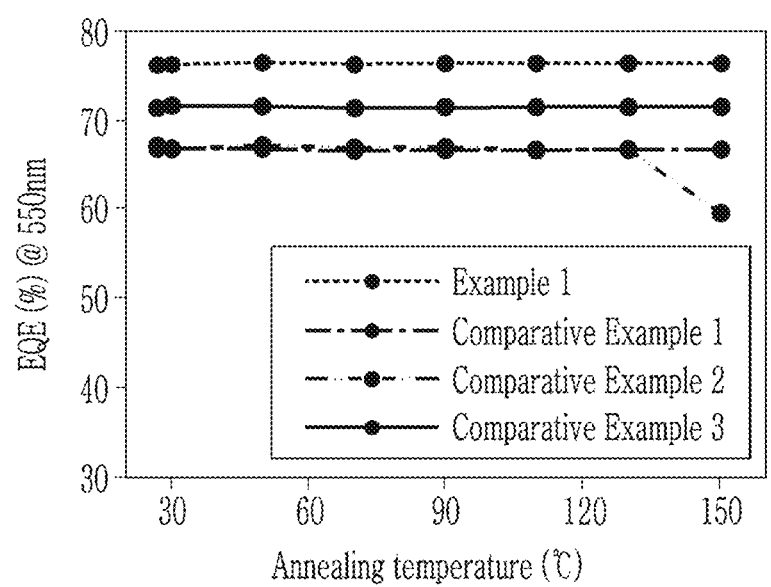
FIG. 24 is a graph showing changes in photoelectric conversion efficiency depending on annealing temperatures of the photoelectric conversion devices according to Example 1 and Comparative Examples 1 to 3.
Figure 25A:
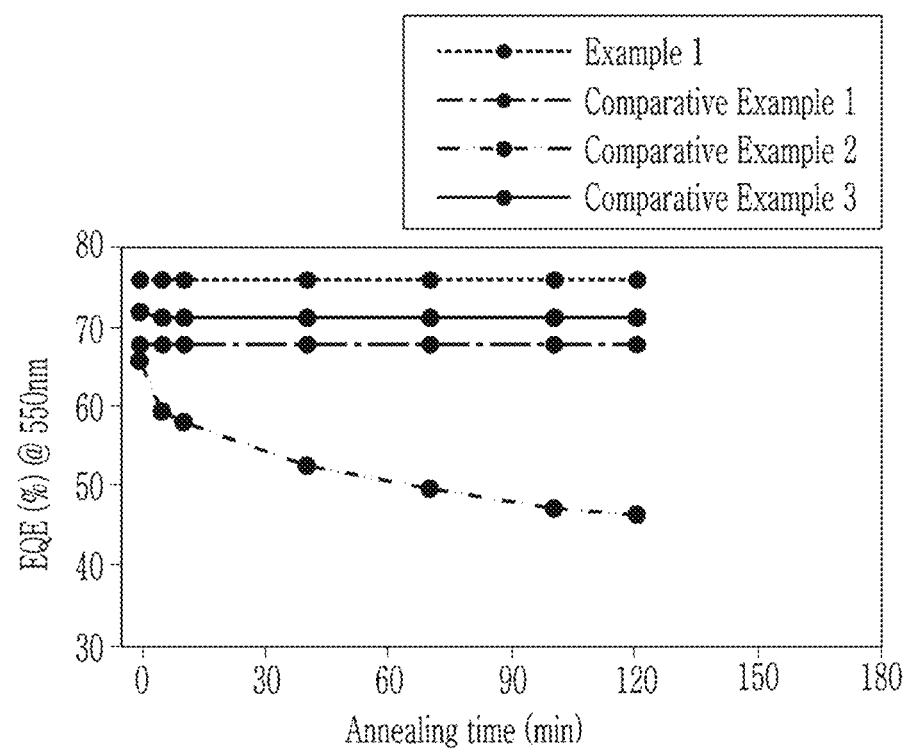
FIG. 25A is a graph showing changes in photoelectric conversion efficiency depending on annealing times of the photoelectric conversion devices according to Example 1 and Comparative Examples 1 to 3.
Figure 25B:
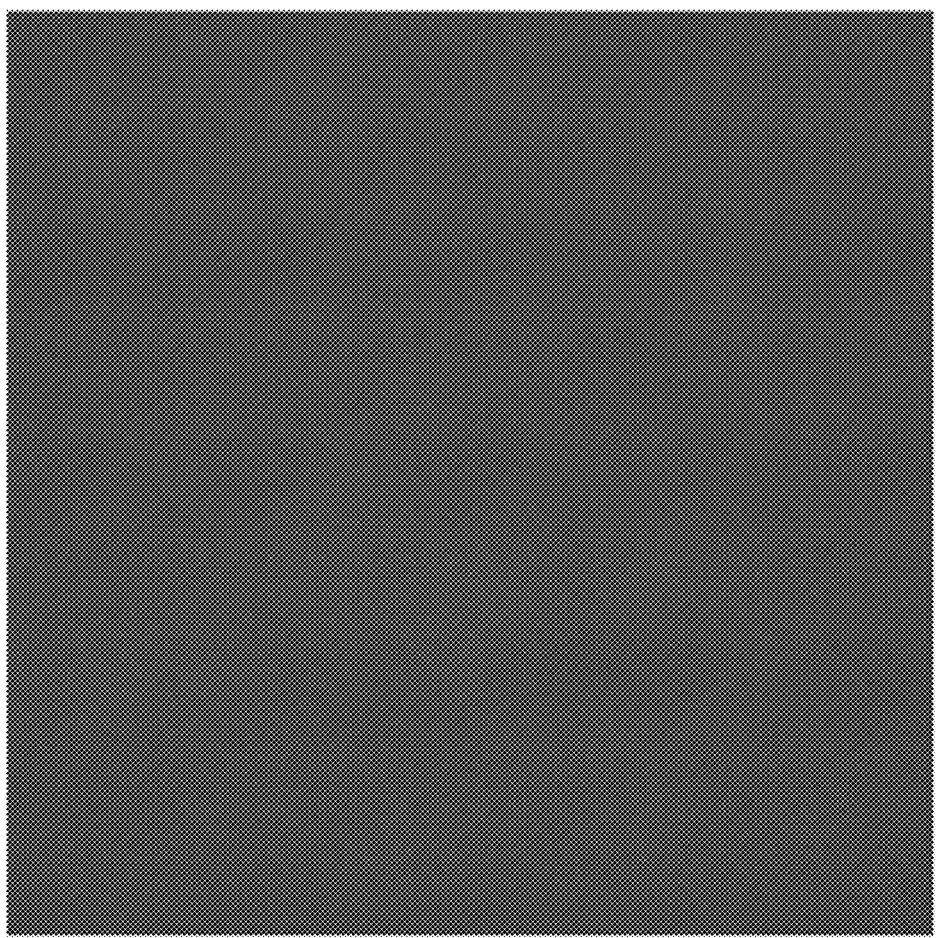
FIGS. 25B and 25C are photographs after annealing of the photoelectric conversion devices according to Example 1 and Comparative Example 2.
Figure 25C:
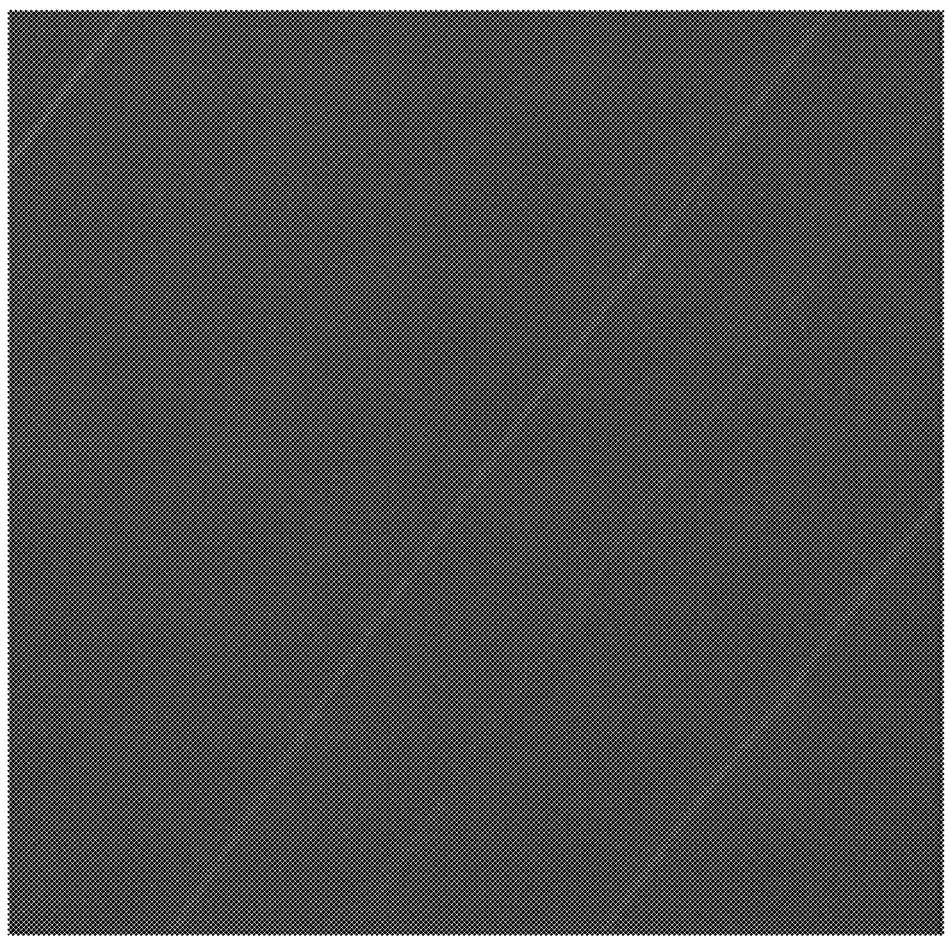

FIG. 24 is a graph showing changes in photoelectric conversion efficiency depending on annealing temperatures of the photoelectric conversion devices according to Example 1 and Comparative Examples 1 to 3, FIG. 25A is a graph showing changes in photoelectric conversion efficiency depending on annealing times of the photoelectric conversion devices according to Example 1 and Comparative Examples 1 to 3, and FIGS. 25B and 25C are photographs after annealing of the photoelectric conversion devices according to Example 1 and Comparative Example 2.

Referring to FIGS. 24 and 25A to 25C, the photoelectric conversion device of Example exhibits excellent heat resistance, compared with the photoelectric conversion devices of Comparative Examples.

Evaluation IX

Leakage current characteristics of the photoelectric conversion device of Example depending on light radiation are evaluated.

Figure 26:
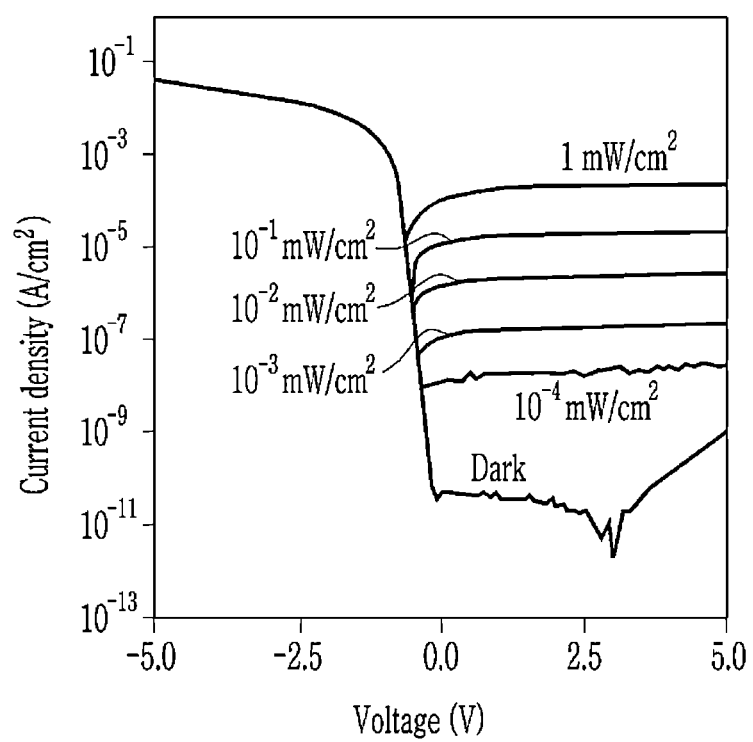
FIG. 26 is a graph showing e current characteristics according to the light intensity of the photoelectric conversion device according to Example 1.
Figure 27:
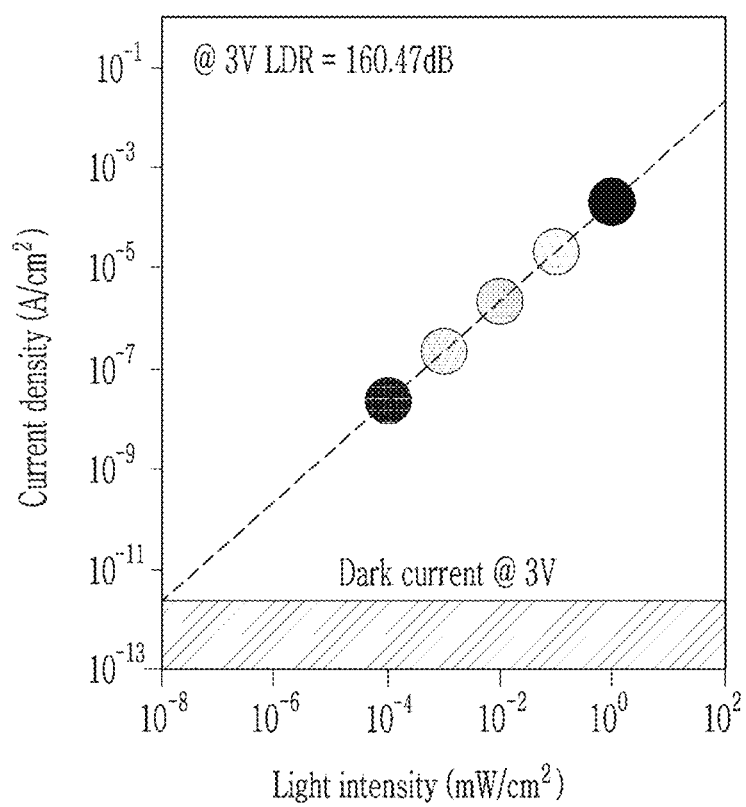
FIG. 27 is a graph showing photocurrent density according to the light intensity of the photoelectric conversion device according to Example 1.
Figure 28:
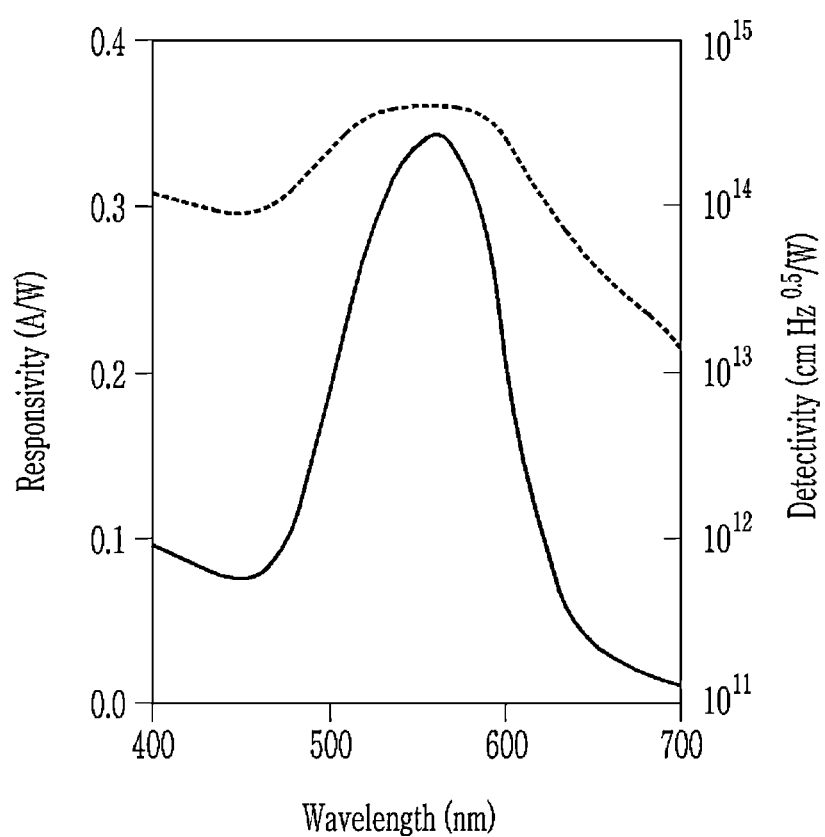
FIG. 28 is a graph showing photoresponse and detectability (@3 V, 1 mW/cm$^2$, λ=553 nm) of the photoelectric conversion device according to Example 1.

FIG. 26 is a graph showing e current characteristics according to the light intensity of the photoelectric conversion device according to Example 1, FIG. 27 is a graph showing photocurrent density according to the light intensity of the photoelectric conversion device according to Example 1, and FIG. 28 is a graph showing photoresponse and detectability (@ 3 V, 1 mW/cm$^2$, λ=553 nm) of the photoelectric conversion device according to Example 1.

Referring to FIGS. 26 to 28 the photoelectric conversion device of Example exhibits satisfactory electrical characteristics.

Evaluation X

The photoelectric conversion devices according to Example and Comparative Examples are respectively applied to design image sensors (FIGS. 4 and 5), and YSNR10 of the image sensors are evaluated.

The YSNR10 of the image sensor is a minimum light dose (unit: lux) in which a ratio of signal to noise (signal/noise) becomes 10, wherein the signal is a signal sensitivity obtained by performing a RGB raw signal calculated by a FDTD (finite difference time domain method) with a color correction step through a color correction matrix (CCM), and the noise is a noise generated when measuring the signal in the image sensor. The color correction step is a step of reducing a difference from the real color by image-processing the RGB raw signal obtained from the image sensor. As the YSNR10 has the lower value, the image characteristics are getting the better in a low light dose.

The results are shown in Table 4.

TABLE 4

| | YSNR10 (lux) |
|---|---|
| Example 1 | 82.1 |
| Comparative Example 1 | 90.5 |
| Comparative Example 2 | 86.2 |
| Comparative Example 3 | 89.8 |

Referring to Table 4, the image sensors manufactured by applying the photoelectric conversion devices according to Example exhibits lower YSNR10 than the image sensors manufactured by applying the photoelectric conversion devices according to Comparative Examples, and accordingly, sensitivity of the image sensor is improved.

While this disclosure has been described in connection with what is presently considered to be practical example embodiments, it is to be understood that inventive concepts are not limited to the disclosed embodiments, but, on the contrary, are intended to cover various modifications and equivalent arrangements included within the spirit and scope of the appended claims.

What is claimed is:

1. A photoelectric conversion device, comprising
    a first electrode;
    a second electrode on the first electrode;
    a photoelectric conversion layer between the first electrode and the second electrode, the photoelectric conversion layer being configured to absorb light in at least one portion of a wavelength spectrum and to convert the absorbed light into an electric signal; and
    a buffer layer between the second electrode and the photoelectric conversion layer, the buffer layer including a mixture of at least two materials, the mixture including a first material and a second material,
    the first material having an energy bandgap of greater than or equal to about 3.2 eV and a HOMO energy level of greater than or equal to about 6.0 eV, and
    the second material having an energy bandgap of less than or equal to about 2.8 eV and a HOMO energy level of greater than or equal to about 6.0 eV.

2. The photoelectric conversion device of claim 1, wherein a LUMO energy level of the buffer layer is deeper or shallower within about 30% of a LUMO energy level of the photoelectric conversion layer.

3. The photoelectric conversion device of claim 2, wherein the LUMO energy level of the buffer layer is about 3.0 eV to about 4.5 eV.

4. The photoelectric conversion device of claim 1, wherein a HOMO energy level of the buffer layer is deeper than a HOMO energy level of the photoelectric conversion layer by greater than or equal to about 0.5 eV.

5. The photoelectric conversion device of claim 4, wherein the HOMO energy level of the buffer layer is about 6.0 eV to about 7.0 eV.

6. The photoelectric conversion device of claim 1, wherein an energy bandgap of the buffer layer is between the energy bandgap of the first material and the energy bandgap of the second material.

7. The photoelectric conversion device of claim 1, wherein a surface roughness of the buffer layer measured by an atomic force microscope is smaller than a surface roughness of a thin film consisting of the first material and a surface roughness of a thin film consisting of the second material, respectively.

8. The photoelectric conversion device of claim 7, wherein the surface roughness of the buffer layer is less than or equal to about 1.2 nm.

9. The photoelectric conversion device of claim 1, wherein the buffer layer has an amorphous structure.

10. The photoelectric conversion device of claim 1, wherein the first material is an organic material comprising an aromatic ring, a heteroaromatic ring, or a combination thereof, and
    the second material is a fullerene or a fullerene derivative.

11. The photoelectric conversion device of claim 10, wherein the first material is represented by Chemical Formula 1:

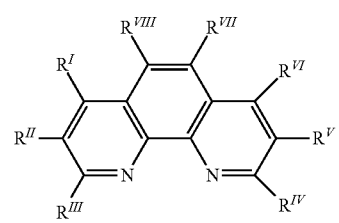

[Chemical Formula 1]

wherein, in Chemical Formula 1,
    $R^I$ to $R^{VIII}$ are independently hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group, and
    $R^I$ to $R^{VIII}$ are independently present or an adjacent two thereof are combined to form a ring.

12. The photoelectric conversion device of claim 1, wherein a mixing volume ratio of the first material and the second material is about 5:5 to about 9:1.

13. The photoelectric conversion device of claim 1, wherein the photoelectric conversion layer comprises an organic absorbing material configured to selectively absorb one of a blue wavelength spectrum, a green wavelength spectrum, a red wavelength spectrum, and a near infrared wavelength spectrum.

14. The photoelectric conversion device of claim 1, wherein the first electrode is an anode and the second electrode is a cathode.

15. The photoelectric conversion device of claim 1, wherein the second electrode is a light-receiving electrode.

16. The photoelectric conversion device of claim 1, wherein the first material is represented by Chemical Formula 1:

[Chemical Formula 1]

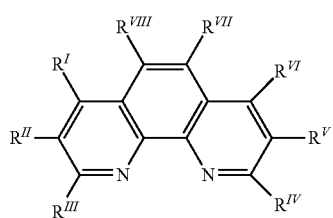

wherein, in Chemical Formula 1,
R$^I$ to R$^{VIII}$ are independently hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group, and
R$^I$ to R$^{VIII}$ are independently present or an adjacent two thereof are combined to form a ring.

17. The photoelectric conversion device of claim 1, wherein the second material is a fullerene or a fullerene derivative.

18. The photoelectric conversion device of claim 1, wherein
the photoelectric conversion layer includes a p-type semiconductor and an n-type semiconductor,
the energy band gap of the first material is about 3.2 eV to about 4.0 eV,
the HOMO energy level of the first material is about 6.0 eV to about 7.0 eV,
the energy band gap of the second material is about 1.8 eV to about 2.8 eV, and
the HOMO energy level of the second material is about 6.0 eV to about 7.0 eV.

19. The photoelectric conversion device of claim 18, wherein the p-type semiconductor is represented by Chemical Formula A:

EDM1-LM1-EAM1      [Chemical Formula A]

wherein, in Chemical Formula A,
EDM1 is an electron donating moiety,
EAM1 is an electron accepting moiety, and
LM1 is a π-conjugated linking moiety that links the electron donating moiety and the electron accepting moiety.

20. The photoelectric conversion device of claim 18, wherein
the n-type semiconductor includes thiophene, a thiophene derivative, fullerene, or a fullerene derivative.

21. An organic sensor comprising:
the photoelectric conversion device of claim 1.

22. The organic sensor of claim 21, further comprising:
a semiconductor substrate stacked with the photoelectric conversion device.

23. The organic sensor of claim 22, further comprising:
a photodiode integrated in the semiconductor substrate.

24. An electronic device comprising:
the organic sensor of claim 21.

25. An electronic device comprising:
the organic sensor of claim 1.

* * * * *